United States Patent
Kawachi

(10) Patent No.: US 11,107,431 B2
(45) Date of Patent: Aug. 31, 2021

(54) DISPLAY DEVICE WITH SHIFT REGISTER SEGMENT START SIGNAL CONTROL IN CASE OF MALFUNCTION

(71) Applicant: TIANMA JAPAN, LTD., Kanagawa (JP)

(72) Inventor: Genshiro Kawachi, Kawasaki (JP)

(73) Assignee: TIANMA JAPAN, LTD., Kanagawa (JP)

( * ) Notice: Subject to any disclaimer, the term of this patent is extended or adjusted under 35 U.S.C. 154(b) by 0 days.

(21) Appl. No.: 16/522,228

(22) Filed: Jul. 25, 2019

(65) Prior Publication Data

US 2020/0035177 A1 Jan. 30, 2020

(30) Foreign Application Priority Data

Jul. 26, 2018 (JP) ............................... JP2018-140659

(51) Int. Cl.
*G09G 3/36* (2006.01)
*G09G 3/34* (2006.01)
*G11C 19/28* (2006.01)

(52) U.S. Cl.
CPC ........... *G09G 3/3677* (2013.01); *G09G 3/342* (2013.01); *G09G 3/3666* (2013.01); *G11C 19/28* (2013.01); *G09G 3/3648* (2013.01); *G09G 2300/0408* (2013.01); *G09G 2310/0286* (2013.01); *G09G 2310/08* (2013.01); *G09G 2330/08* (2013.01);

(Continued)

(58) Field of Classification Search
CPC .... G09G 3/3666; G09G 3/342; G09G 3/3677; G09G 3/3648; G09G 3/3674; G09G 2330/12; G09G 2330/08; G09G 2310/0286; G09G 2310/08; G09G 2370/08; G09G 2380/10; G09G 2300/0408; G09G 2300/0426; G11C 19/28; G11C 19/285; G11C 19/287

See application file for complete search history.

(56) References Cited

U.S. PATENT DOCUMENTS 5,465,053 A * 11/1995 Edwards ................. G06F 11/27
345/93
6,467,057 B1 * 10/2002 Wang .................... G09G 3/3677
714/726

(Continued)

FOREIGN PATENT DOCUMENTS

JP 2007-004176 A 1/2007
JP 2014-182218 A 9/2014

*Primary Examiner* — Darlene M Ritchie
(74) *Attorney, Agent, or Firm* — Sughrue Mion, PLLC

(57) ABSTRACT

A display device includes: a display unit including pixels; a shift register connected to scan signal lines and outputting a pulse signal sequentially, the shift register being divided into shift register segments; a driver generating a clock signal to be supplied to each segment, and a video signal to be input to each pixel; and a controller controlling the driver for generating the clock signal and the video signal, the controller monitoring output of each segment and detecting a malfunction of any of the segments. A shift register unit of a first stage of each segment outputs the pulse signal at a prescribed timing after receiving a start signal. The unit of a stage differing from the first stage outputs the pulse signal at a prescribed timing after receiving a carry signal based on the pulse signal from the unit of a preceding stage.

10 Claims, 20 Drawing Sheets

(52) U.S. Cl.
CPC ..... *G09G 2330/12* (2013.01); *G09G 2380/10* (2013.01)

(56) References Cited

U.S. PATENT DOCUMENTS

| | | | |
|---|---|---|---|
| 9,425,611 B2* | 8/2016 | Zhang | G09G 3/3677 |
| 10,210,835 B2* | 2/2019 | Han | G09G 3/3677 |
| 2007/0040792 A1 | 2/2007 | Kwag et al. | |
| 2009/0045759 A1* | 2/2009 | Kang | H05B 45/10 |
| | | | 315/307 |
| 2015/0026506 A1* | 1/2015 | Lee | G06F 11/0751 |
| | | | 714/3 |
| 2017/0039974 A1* | 2/2017 | Kang | G09G 3/20 |
| 2017/0124938 A1* | 5/2017 | Kim | G09G 3/32 |
| 2017/0255504 A1* | 9/2017 | Fletcher | G09G 3/006 |
| 2019/0138124 A1* | 5/2019 | Kim | G06F 3/044 |
| 2019/0195940 A1* | 6/2019 | Chen | G09G 3/3677 |
| 2019/0266934 A1* | 8/2019 | Seong | G11C 19/28 |

\* cited by examiner

SR UNIT CIRCUIT

MAIN SR

|    | CHANNEL LENGTH L(um) | CHANNEL WIDTH W(um) |
|----|---|------|
| M1 | 12 | 300 |
| M2 | 12 | 3000 |
| M3 | 12 | 100 |
| M4 | 12 | 100 |

FIG. 10A

DUMMY SR

|    | CHANNEL LENGTH L(um) | CHANNEL WIDTH W(um) |
|----|---|-----|
| M1 | 12 | 300 |
| M2 | 12 | 100 |
| M3 | 12 | 600 |
| M4 | 12 | 100 |

FIG. 10B

DISPLAY DEVICE WITH SHIFT REGISTER SEGMENT START SIGNAL CONTROL IN CASE OF MALFUNCTION

CROSS-REFERENCE TO RELATED APPLICATIONS

This Non-provisional application claims priority under 35 U.S.C. § 119(a) on Patent Application No. 2018-140659 filed in Japan on Jul. 26, 2018, the entire content of which is hereby incorporated by reference.

BACKGROUND

The present invention relates to an image display technology.

Display panels such as in-vehicle LCD (liquid crystal display) or OLED (organic light emitting diode) need to have narrower frame and curved surface for better design quality. As one way to meet those requirements, GIP (gate in panel) structure panels are growing in popularity. In the GIP structure panel, a driver IC is mounted on one of the short sides, and the gate driving circuit is embedded on a glass substrate.

Also as a method to reduce power consumption in this type of display panel, a technology to divide the driving circuit for gate lines into segments is disclosed.

For example, Japanese Patent Application Laid-open Publication No. 2014-182218 discloses a liquid crystal display device in which a shift register connected to scan signal lines are divided into a plurality of groups, a plurality of clock signal lines that are independent of each other are connecting the driver IC and the respective groups, and by selectively supplying the clock signal from the driver IC to the plurality of groups, the power consumption is reduced.

On the other hand, Japanese Patent Application Laid-open Publication No. 2007-004176 discloses a shift register for a display device that has at least two display areas each of which includes pixels and signal lines connected to those pixels, and at least two stage groups each of which includes a plurality of stages connected to each other and configured to generate output signal in a certain order, wherein each stage group divides a shift register into a plurality of groups by sending an output signal to the signal lines of one of the display areas. With this configuration, power consumption is further reduced.

SUMMARY

An aspect of the disclosure is a display device, including: a display unit that includes a plurality of pixels that are defined by a plurality of scan signal lines and a plurality of video signal lines; a shift register connected to the plurality of scan signal lines and outputting a pulse signal sequentially, the shift register being divided into a plurality of shift register segments each including at least one shift register unit; a clock signal line that supplies a clock signal to each of the shift register segments; a start signal line that supplies a start signal to each of the shift register segments; a driver that generates a clock signal to be supplied to each of the shift register segments, and a video signal to be input to each of the pixels; and a controller that controls the driver for generating the clock signal and the video signal, the controller monitoring output of each of the shift register segments and detecting a malfunction of any of the shift register segments, wherein the shift register unit of a first stage of each of the shift register segments outputs the pulse signal at a prescribed timing after receiving the start signal via the start signal line, and wherein the shift register unit of a stage differing from the first stage of each of the shift register segments outputs the pulse signal at a prescribed timing after receiving a carry signal based on the pulse signal output by the shift register unit of a preceding stage.

It is to be understood that both the foregoing general description and the following detailed description are exemplary and explanatory and are not restrictive of this disclosure.

BRIEF DESCRIPTION OF THE DRAWINGS

FIG. 5 is a timing chart showing the clock signals supplied to the shift register segments included in the display device of Embodiment 1 and the scan signals output from the shift register segments, and the like.

FIGS. 10A and 10B are diagrams for illustrating the design examples of the sizes of transistors constituting a shift register unit of Embodiment 4.

EMBODIMENTS

Below, a display device using a shift register GIP circuit will be described.

A shift register GIP circuit can be realized relatively easily by implementing a shift register that generates a signal for driving gate lines using an oxide TFT (thin film transistor), a low temperature poly-silicon (LTPS) TFT, or the like. The GIP circuit implemented with TFT, however, has reliability concerns, which hinders use of GIP circuits for in-vehicle displays that need to operate under harsh conditions.

In the shift register circuit implemented with TFT, if erroneous operation occurs in a scan line inside of the circuit due to a deteriorated TFT, normal display cannot be performed by the subsequent scan lines. This could be a serious problem especially in safety components such as an in-vehicle panel for an electronic cluster.

Figure 16:
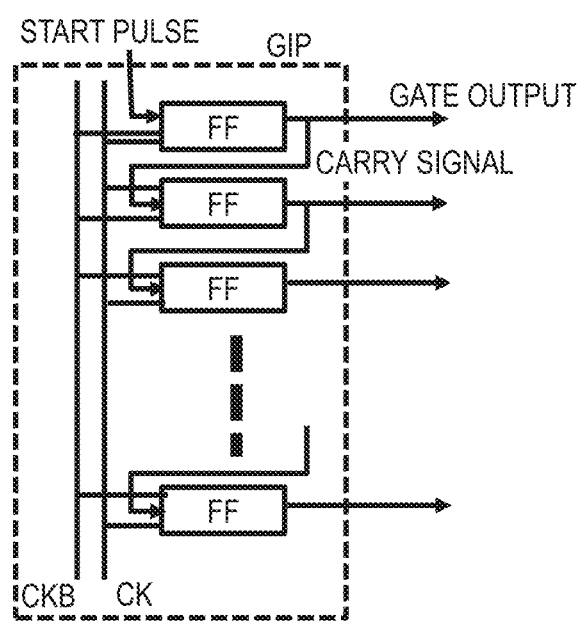
FIG. 16 is a diagram for explaining the configuration of a shift register GIP circuit.

FIG. 16 is a diagram for explaining the configuration of a shift register GIP circuit.

As illustrated in FIG. 16, the shift register GIP circuit is constituted of a plurality of flip-flops (FF) connected to each other. In this example, each flip flop is supplied with a clock CK of a prescribed frequency and a clock CKB in reverse phase. Also, a start signal (start pulse) is input to the flip-flop of the first stage. When the flip-flop in each stage outputs a pulse, the pulse is supplied to the gate line of the pixel as a gate signal, and is also input as a carry signal to the flip-flop of the next stage. As a result, the flip-flop of each stage outputs a pulse sequentially from the first stage.

Figure 17A:
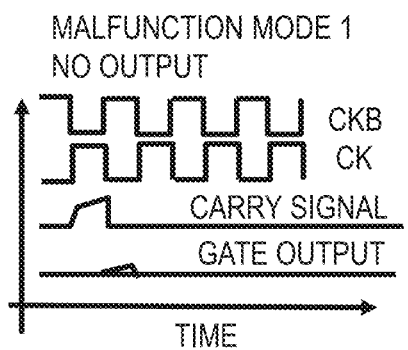
FIGS. 17A and 17B are diagrams for explaining the malfunction mode in the shift register GIP circuit.
Figure 17B:
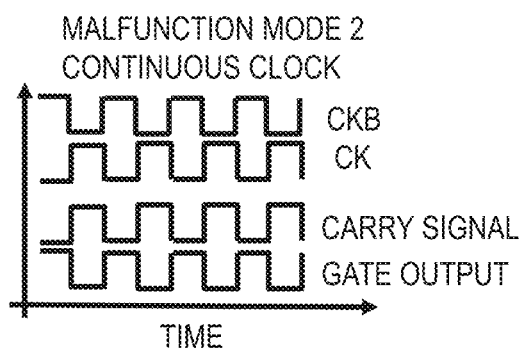

FIGS. 17A and 17B are diagrams for explaining the malfunction mode in the shift register GIP circuit.

One example of the malfunction mode of the shift register GIP circuit is a mode in which the output pulse voltage of one of the flip-flops disappears due to a decrease in input carry signal voltage or a short circuit failure of the TFT, and the like, and because the carry signal is not transferred, the flip-flops of the following stages do not output a pulse (FIG. 17A). This is referred to as a "no output mode".

Another example of the malfunction mode is a mode in which the gate line cannot be kept at a low level due to a shift in threshold voltage of a reset TFT, and as a result, the clock signal is output to all of the gate lines in the stages that follow a certain stage (FIG. 17B). This is referred to as a "continuous clock mode."

Figure 18:
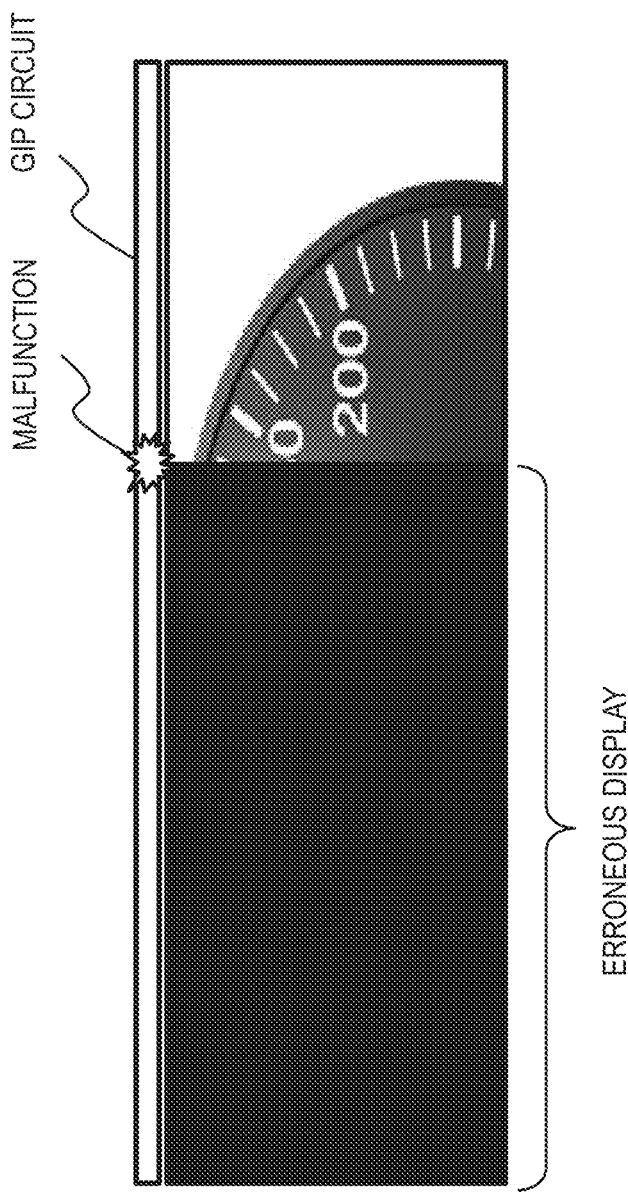
FIG. 18 is a diagram for explaining a display defect of a display panel using the shift register GIP circuit.

FIG. 18 is a diagram for explaining a display defect of a display panel using the shift register GIP circuit.

The GIP circuit illustrated in FIG. 18 is the GIP circuit of FIG. 16 that is rotated by 90 degrees. That is, in FIG. 16, the flip-flop in the first stage is located at the upper end, but in FIG. 18, the flip-flop in the first stage is located at the right end. In FIG. 18, the components of the GIP circuit such as flip-flops, clock signal lines, output signal lines, and carry signal lines are not illustrated.

In this example, when a failure occurs in one of the flip-flops, the subsequent flip-flops do not output pulses normally, causing a display defect in all the areas in the subsequent stages. FIG. 18 illustrates an example of an in-vehicle display panel for displaying a speedometer where the speed cannot be indicated because of the display malfunction in the most of the display areas.

According to one embodiment of the present invention, it is possible to provide a display device with high fault tolerance while realizing a narrow frame by adopting a GIP circuit using a TFT or the like.

Below, embodiments of the present invention will be explained in detail with reference to figures. The embodiments are mere examples to achieve the present invention, and shall not limit the technical scope of the present invention. Configurations common between the respective figures are given the same reference characters.

Embodiment 1

Figure 1:
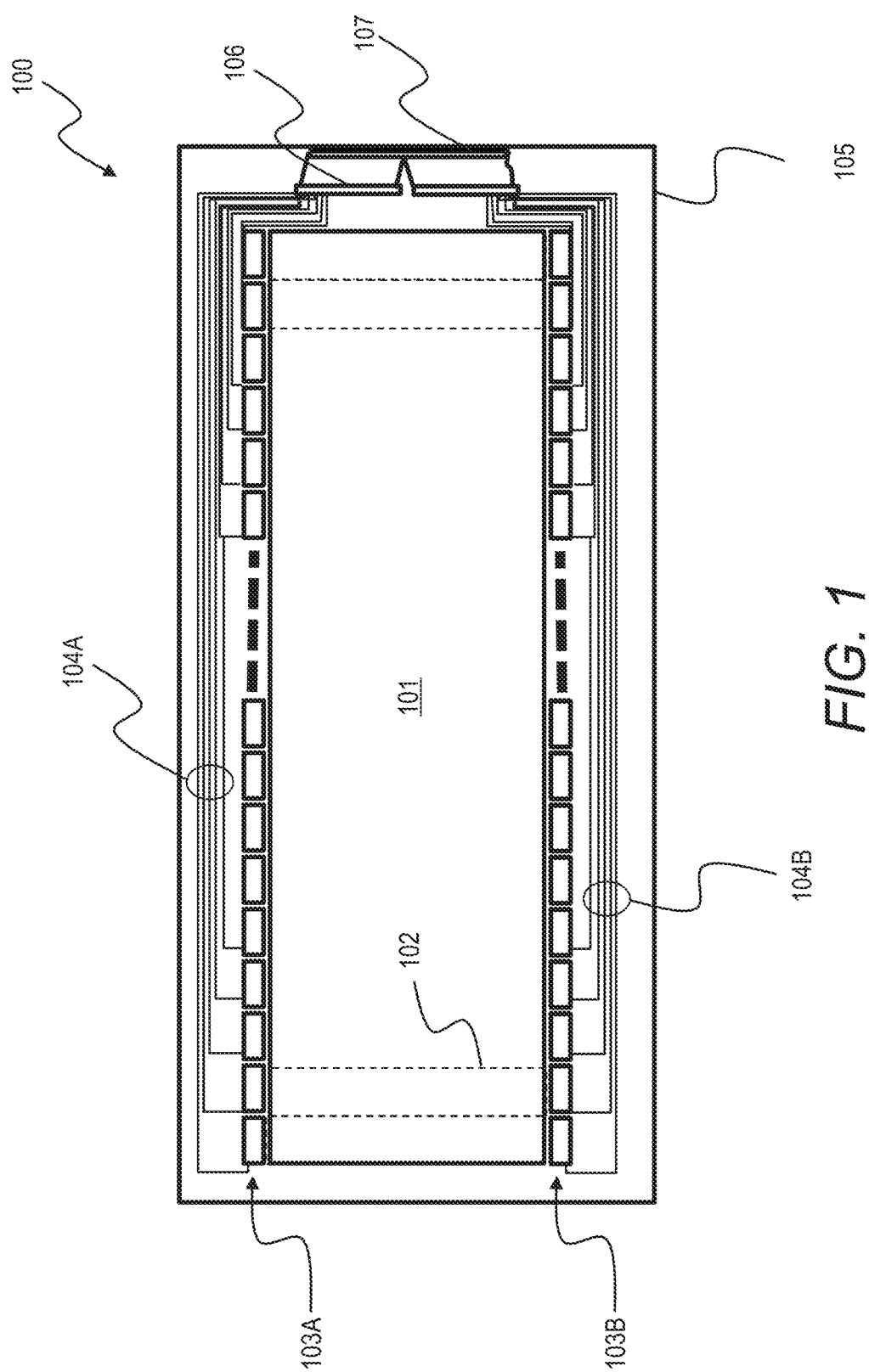
FIG. 1 is a diagram illustrating the structure of a display device of Embodiment 1.

FIG. 1 is a diagram illustrating the structure of a display device 100 of Embodiment 1.

On a substrate 105 of the display device 100, a rectangular display unit 101 in which a large number of pixels are arranged in a grid pattern is formed. In this example, an LCD is described as an example of the display device 100, but the display device 100 may be something other than an LCD (such as OLED).

As described later, a plurality of scan signal lines G (see FIG. 2) and a plurality of video signal lines D (see FIG. 2) are formed on the substrate 105 to run through the display unit 101. The scan signal lines and the video signal lines intersect with each other, and divide the display unit 101 in a grid-like manner. An area surrounded by two adjacent scan signal lines G and two adjacent video signal lines D is one pixel. When it is necessary to distinguish each of the plurality of scan signal lines G, they may be described as scan signal lines G1, G2 and G3, respectively. Similarly, the video signal lines may be described as video signal lines D1, D2, and D3, respectively.

In the example of FIG. 1, the scan signal lines are formed in parallel with the short side of the display unit 101, and the video signal lines are formed in parallel with the long side of the display unit 101. A driver IC 106 is provided on the substrate 105 in the vicinity of one short side of the display unit 101. The driver IC 106 includes an operation signal drive circuit (not shown in the figure) and a video signal drive circuit (not shown in the figure).

The driver IC 106 receives various signals such as a power supply voltage, a ground voltage, a timing signal, and a video signal from an external device (not shown in the figure) via a connection terminal 107. The external device includes at least a controller IC 1204 (see FIG. 12) that outputs a timing signal and a video signal. That is, the driver IC 106 generates the clock signal, the start signal, and the video signal according to the control of the controller IC 1204, and those signals are input to the clock signal lines, the start signal supply wiring lines, and the video signal lines, respectively.

A shift register connected to the scan signal lines is disposed on the substrate 105 along at least one (both in the example of FIG. 1) long side of the display unit 101. The shift register at each side is divided into a plurality of shift register segments 103. In FIG. 1, the shift register segments 103 disposed along one of the two long sides is referred to as shift register segments 103A, and the shift register segments 103 disposed along the other side is referred to as shift register segments 103B. When the description applies to both of them, they are also collectively referred to as the shift register segments 103.

In order to distinguish each of the plurality of shift register segments 103A, each shift register segment 103A may be described as shift register segments 103A-1 and 103A-2. Similarly, each shift register segment 103B may be described as shift register segments 103B-1 and 103B-2 (see FIG. 2).

Each shift register segment 103 is constituted of a prescribed number of shift register units (described later), and each shift register unit is connected to one scan signal line. A plurality of pixels connected to a plurality of scan signal lines connected to a plurality of shift register units included in one shift register segment 103 form one display unit segment 102. In the example of FIG. 1, only some of the display unit segments 102 are illustrated.

Each shift register segment 103 is connected with a start signal supply wiring line (start signal line) 104 for supplying a start signal from the driver IC 106 to the shift register unit of the first stage. In FIG. 1, the start signal supply wiring line 104 connected to the shift register segment 103A is described as a start signal supply wiring line 104A, and the start signal supply wiring line 104 connected to the shift register segment 103B is described as a start signal supply wiring line 104B. When the description applies to both of them, they are also collectively referred to as the start signal supply wiring lines 104.

In order to distinguish each of the plurality of start signal supply wiring lines 104A, respective start signal supply wiring lines 104A may be described as start signal supply wiring lines 104A-1 and 104A-2. Similarly, respective start signal supply wiring lines 104B may be described as start signal supply wiring lines 104B-1 and 104B-2 (see FIG. 2).

Although not illustrated in FIG. 1, a clock signal line and the like are connected to each shift register segment 103. This will be described in detail later (see FIG. 2 and the like).

Figure 2:
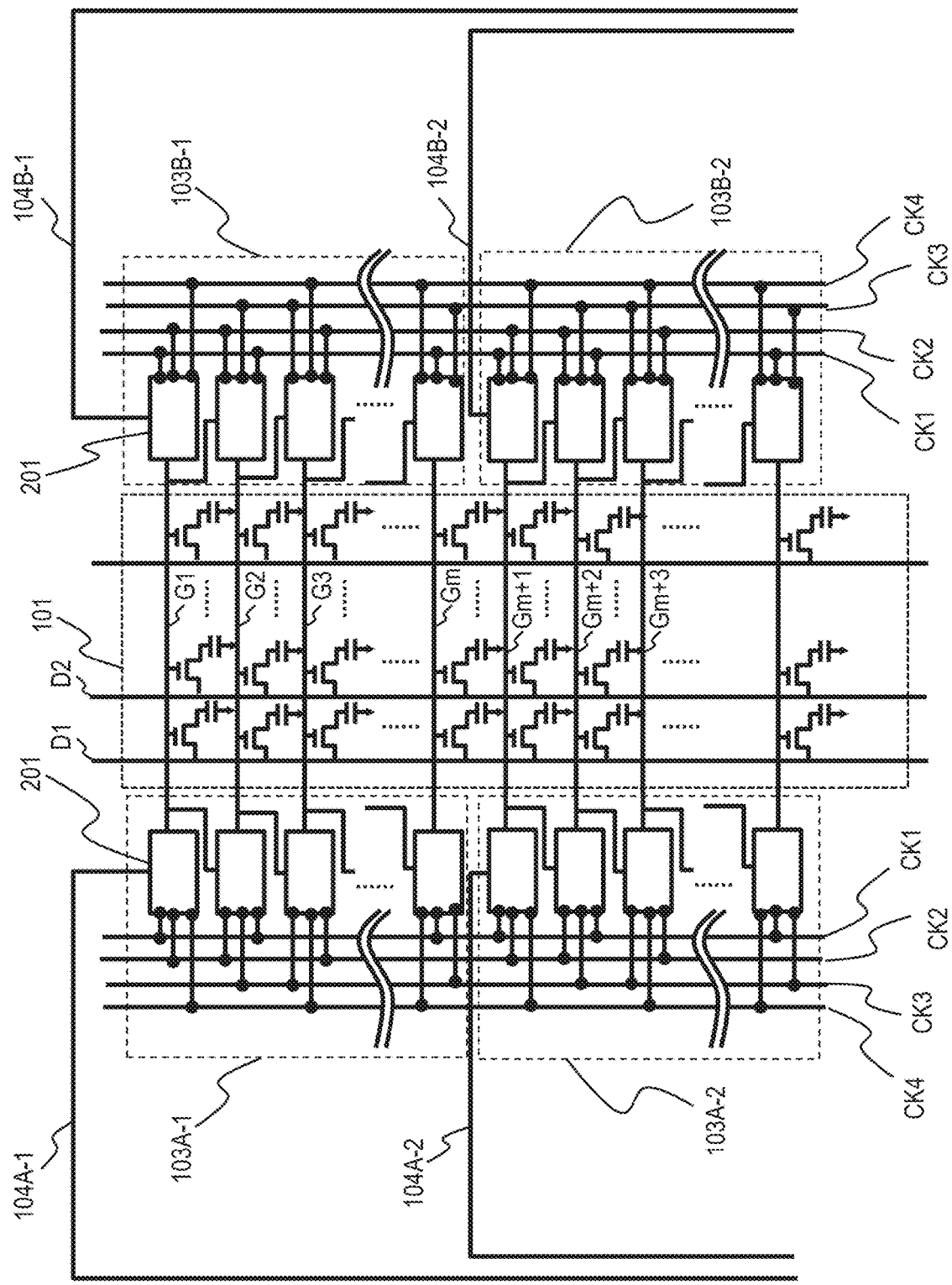
FIG. 2 is a diagram for explaining a display unit 101 and shift registers of the display device of Embodiment 1 in detail.

FIG. 2 is a diagram for explaining the display unit 101 and the shift registers of the display device 100 of Embodiment 1 in detail.

FIG. 1 illustrates the display unit 101 such that the longitudinal direction thereof coincides with the horizontal direction of the drawing, but FIG. 2 illustrates the display unit 101 such that the longitudinal direction thereof coincides with the vertical direction of the drawing.

The display unit 101 includes a plurality of pixels arranged in a grid pattern. Each pixel includes a pixel electrode, a switching element that turns on/off application of a video signal to the pixel electrode, and a common electrode corresponding to the pixel electrode. The common electrode is electrically connected to the common potential and forms a capacitance with the corresponding pixel electrode.

In this embodiment, a TFT is used for the switching element. The TFT of each pixel is connected to the scan signal line G and the video signal line D, and is turned on by the scan signal input from the scan signal line G. The video signal line D (for example, the video signal lines D1 and D2 in FIG. 2) applies a voltage (that is, a signal representing the gradation value of each pixel) to the pixel electrode via the TFT in the on state.

Each shift register (SR) unit 201 is connected to one scan signal line G (for example, the scan signal lines G1, G2, and G3 in FIG. 2). A prescribed number of shift register units 201 are connected to each other and form the shift register (SR) segment 103. In the example of FIG. 2, a shift register segment 1 (103A-1) and a shift register segment 2 (103A-2) are formed at one of the long sides of the display portion 101.

At the other long side, a shift register segment 3 (103B-1) and a shift register segment 4 (103B-2) are formed. These are provided as spares in case the shift register segment 1 (103A-1) or the shift register segment 2 (103A-2) fails, and the structures thereof are the same as those of the shift register segment 1 (103A-1) and shift register segment 2 (103A-2).

Each scan signal line G is connected to both the shift register unit 201 of the shift register segment 103A on one long side and the shift register unit 201 of the shift register segment 103B on the other long side. The display device 100 does not have to include the shift register segment 103B, for example, but in this case, the shift register segment 103B cannot be replaced as a spare for the defective shift register segment 103A.

The shift register units 201 of each shift register segment 103 output a pulse signal to the scan signal lines in the order of connection. In the example of FIG. 2, the shift register unit 201 in the first stage of the shift register segment 1 (103A-1) (or in other words, the shift register unit 201 farthest from the shift register segment 2 (103A-2)) outputs a pulse signal to the scan signal line G1, and then, the next shift register unit 201 outputs a pulse signal to the scan signal line G2.

Similarly, other shift register units 201 output a pulse signal successively. After the shift register unit 201 in the final stage of the shift register segment 1 (103A-1) (or in other words, the shift register unit 201 closest to the shift register segment 2 (103A-2)) outputs a pulse signal to the scan signal line Gm, the shift register unit 201 in the first stage of the shift register segment 2 (103A-2) (or in other words, the shift register unit 201 closest to the shift register segment 1 (103A-1) outputs a pulse signal to the scan signal line Gm+1.

Thereafter, similarly, other shift register units 201 of the shift register segment 2 (103A-2) output a pulse signal successively. Although not illustrated in FIG. 2, this operation is performed in the shift register segment 103A disposed after the shift register segment 2 (103A-2).

A start signal supply wiring line 104 is connected to the shift register unit 201 in the first stage of each shift register segment 103, and a start signal (also described as a start pulse) is supplied via the wiring line. In the example of FIG. 2, the start signal supply wiring line 1 (104A-1), start signal supply wiring line 2 (104A-2), start signal supply wiring line 3 (104B-1), and start signal supply wiring line 4 (104B-2) are respectively connected to the shift register units 201 in the first stage of the shift register segment 1 (103A-1), shift register segment 2 (103A-2), shift register segment 3 (103B-1) and shift register segment 4 (103B-2).

For example, when a start pulse is supplied to the shift register unit 201 of the first stage of the shift register segment 1 (103A-1) through the start signal supply wiring line 1, output of pulse signals is sequentially performed from the shift register unit 201 of the first stage. When the output of the start pulse is performed by the shift register unit 201 of the final stage of shift register segment 1 (103A-1), a start pulse is supplied to the shift register unit 201 of the first stage of the shift register segment 2 (103A-2), and the output of pulse signals is sequentially performed from the shift register unit 201 of the first stage.

Four clock signal lines CK1 to CK4 are connected to each shift register segment 103. The operation of the respective shift register units 201 based on the clock signals supplied via these clock signal lines will be described later.

Figure 3:
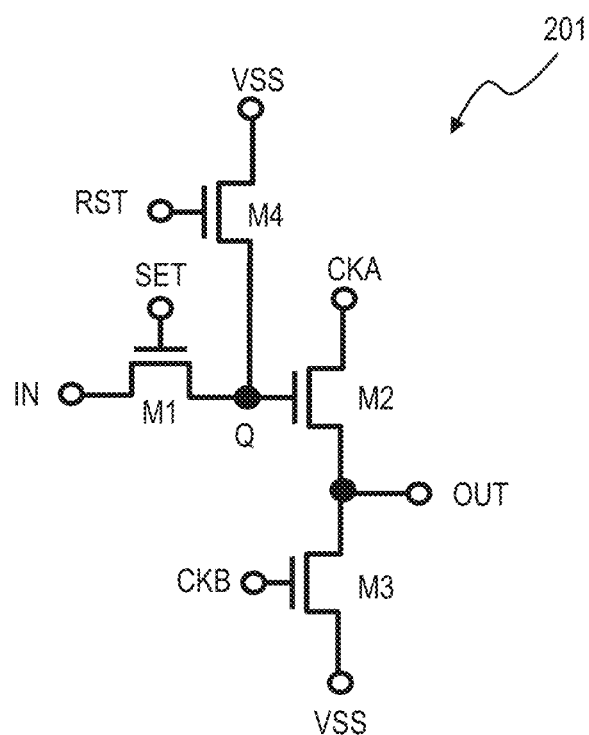
FIG. 3 is a diagram for explaining the configuration of a shift register unit of the display device of Embodiment 1.

FIG. 3 is a diagram for explaining the configuration of the shift register unit 201 of the display device 100 of Embodiment 1.

The shift register unit 201 includes a clock terminal CKA, a clock terminal CKB, a ground terminal VSS, an input terminal IN, a set terminal SET, a reset terminal RST, and an output terminal OUT, and is constituted of transistors M1 to M4.

Figure 4:
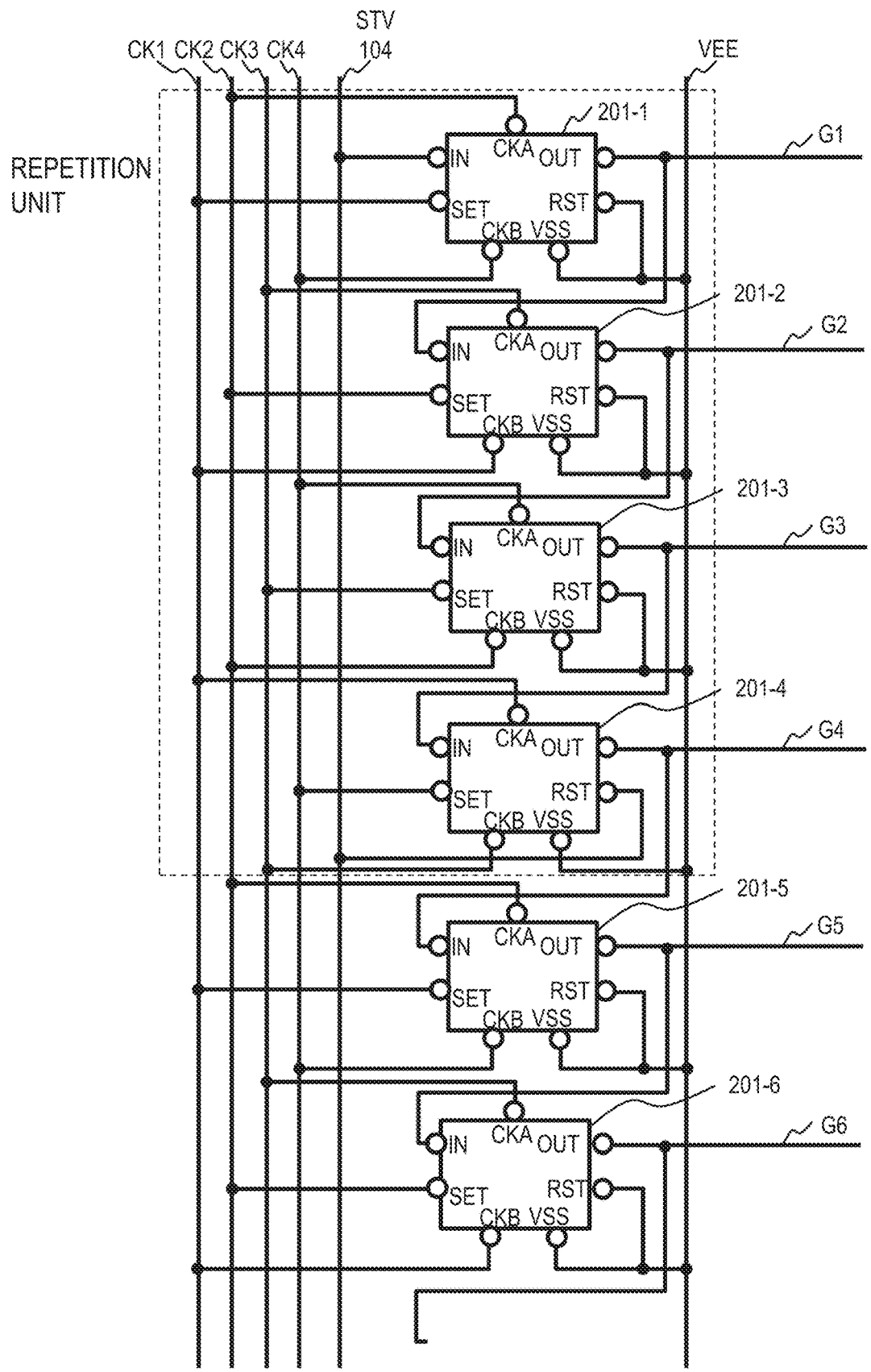
FIG. 4 is a diagram for explaining the configuration of a shift register segment of the display device of Embodiment 1.

FIG. 4 is a diagram for explaining the configuration of the shift register segment 103 of the display device 100 of Embodiment 1.

In this embodiment, four shift register units 201 connected to each other form one repetition unit. That is, the number of the shift register units 201 included in one shift register segment 103 is one of the multiples of 4. FIG. 4 illustrates six of the plurality of shift register units 201 belonging to the shift register segment 103 (shift register units 201-1 to 201-6), but among them, four shift register units connected to the scan signal lines G1 to G4 (that is, shift register units 201-1 to 201-4) constitute one repetition unit.

Below, the mutual connection of the shift register units 201-1 to 201-4 constituting the repetition unit, and the clock signal lines connected thereto will be described. The same applies to the connection of the shift register units 201 that constitute another repetition unit.

The clock signal line CK1 is connected to the set terminal SET of the shift register unit 201-1, the clock terminal CKB of the shift register unit 201-2, and the clock terminal CKA of the shift register unit 201-4.

The clock signal line CK2 is connected to the clock terminal CKA of the shift register unit 201-1, the set terminal SET of the shift register unit 201-2, and the clock terminal CKB of the shift register unit 201-3.

The clock signal line CK3 is connected to the clock terminal CKA of the shift register unit 201-2, the set terminal SET of the shift register unit 201-3, and the clock terminal CKB of the shift register unit 201-4.

The clock signal line CK4 is connected to the clock terminal CKB of the shift register unit 201-1, the clock terminal CKA of the shift register unit 201-3, and the set terminal SET of the shift register unit 201-4.

The output terminals OUT of the shift register units 201-1 to 201-4 are connected to the scan signal lines G1 to G4, respectively, to supply scan signals, and are also connected to the input terminals IN of the subsequent shift register units 201-2 to 201-5 to supply the scan signals as carry signals.

In the example of FIG. 4, the shift register unit 201-1 is located at the first stage of the shift register segment 103. Therefore, the input terminal IN of the shift register unit 201-1 is connected to a start signal supply wiring line (STV) 104, and receives the supply of the start pulse corresponding to the shift register segment 103. If the shift register unit 201 is not in the first stage of the shift register segment 103, the input terminal IN thereof is connected to the output terminal OUT of the shift register unit 201 of the preceding stage.

An off signal line VEE is connected to the ground terminals VSS of the shift register units 201-1 to 201-4 and the reset terminals RST of the shift register units 201-1 to 201-3 to supply an off voltage. The potential of the off voltage is the low-level potential of the scan signal line G. The reset terminal RST of the shift register unit 201-4 is connected to the start signal supply wiring line (STV) 104, and receives the supply of the start pulse corresponding to the shift register segment 103 that the shift register unit 201-4 belongs to.

Figure 5:
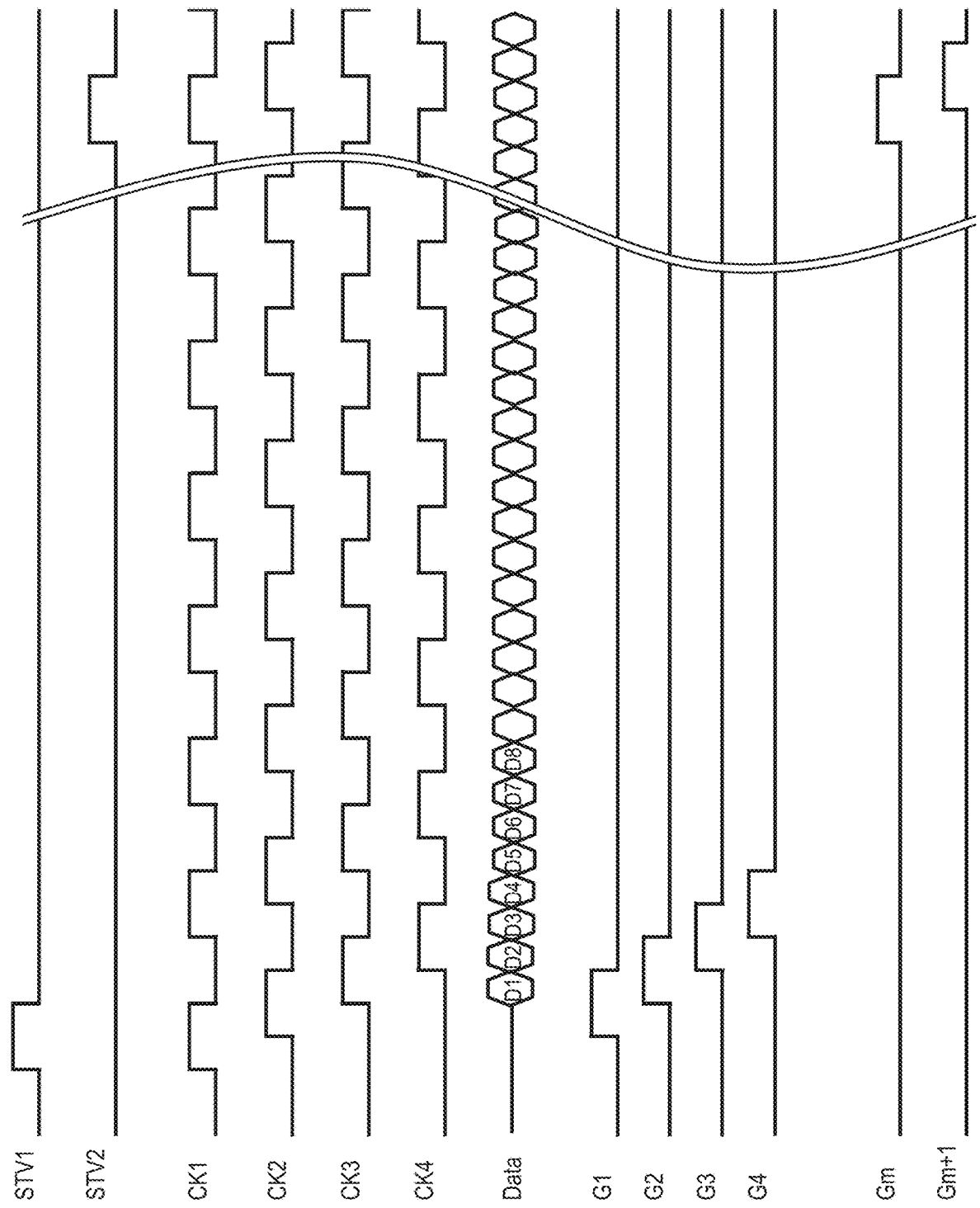

FIG. 5 is a timing chart showing the clock signals supplied to the shift register segments 103 included in the display device 100 of Embodiment 1 and the scan signals output from the shift register segments 103, and the like.

Below, the operation of the respective shift register units 201 belonging to the shift register segments 103 will be explained with reference to FIGS. 3 to 5.

The clock signal line CK1 supplies a clock signal of a prescribed frequency. The clock signal line CK2 supplies a clock signal with a time difference of a quarter cycle after the clock signal supplied by the clock signal line CK1. The clock signal line CK3 supplies a clock signal with a time difference of a quarter cycle after the clock signal supplied by the clock signal line CK2. The clock signal line CK4 supplies a clock signal with a time difference of a quarter cycle after the clock signal supplied by the clock signal line CK3.

The start pulse (STV1 in FIG. 5) is supplied to the input terminal IN of the shift register unit 201-1 via the start signal supply wiring line 104, and at the same time, the clock signal supplied from the clock signal line CK1 to the set terminal SET rises, which charges the gate of the transistor M2. Thereafter, when the clock signal supplied from the clock signal line CK2 to the clock terminal CKA rises, the potential of the output terminal OUT reaches at a high level. This causes the gate of the TFT of each pixel connected to the scan signal line G1 to be charged, which turns on each TFT, and as a result, the voltage of the video signal line D is applied to the pixel electrode of each pixel.

When the clock signal supplied from the clock signal line CK4 to the clock terminal CKB rises, the transistor M3 is turned on, and the gate of the TFT of each pixel is discharged through the scan signal line G1 connected to the output terminal OUT, which turns off each TFT.

The input terminal IN of the shift register unit 201-2 is applied with a voltage of the scan signal line G1 that rises with a time difference of a quarter clock cycle from the start pulse. The set terminal SET of the shift register unit 201-2 receives, from the clock signal line CK2, a clock signal with a time difference of a quarter cycle from the clock signal of the clock signal line CK1. The clock terminal CKA of the shift register unit 201-2 receives, from the clock signal line CK3, a clock signal with a time difference of a quarter cycle from the clock signal of the clock signal line CK2. The clock terminal CKB of the shift register unit 201-2 receives, from the clock signal line CK1, a clock signal with a time difference of a quarter cycle from the clock signal of the clock signal line CK4. As a result, the potential of the output terminal OUT of the shift register unit 201-2 reaches at a high level and then low level with a time difference of a quarter cycle compared to the output terminal OUT of the shift register unit 201-1.

In a manner similar to above, the shift register units 201-3 and 201-4 are sequentially activated. Thereafter, the shift register units 201 (such as the shift register unit 201-5) belonging to the next repetition unit and the shift register units 201 belonging to the subsequent repetition unit also operate in a manner similar to above. That is, each shift register unit 201 outputs a pulse signal at a prescribed timing after receiving the pulse signal (start pulse or carry signal) at the input terminal IN (in the example of FIGS. 3 to 5, with a time difference of a quarter clock cycle).

As a result, if all shift register units 201 belonging to the shift register segment 103 operate normally, the potentials of the scan signal lines G1 to Gm sequentially rise with a time difference of a quarter cycle each, and then go back down.

The input terminal IN of the shift register unit 201 of the first stage of the shift register segment 103 (shift register segment 103A-2 of FIG. 2 for example) that comes after the shift register segment 103 (shift register segment 103A-1 of FIG. 2, for example) described above receives a start pulse (STV2 of FIG. 5, for example) via the start signal supply wiring line 104 for that shift register segment 103 (the start signal supply wiring line 104A-2 of FIG. 2) at the timing when the potential of the scan signal line Gm rises. Thereafter, the operation similar to above is performed in the shift register segments 103 of the subsequent stages.

The start pulse is supplied to each shift register segment 103 from the driver IC without going through the shift register segment 103 of the preceding stage. Therefore, the start pulse is supplied to the shift register segment 103 of the subsequent stage at the correct timing whether or not the shift register segment 103 of the preceding stage is operating normally. As a result, the shift register segment 103 of the subsequent stage can operate normally regardless of the state of the preceding stage as long as the shift register segment itself is in a normal state.

Figure 6:
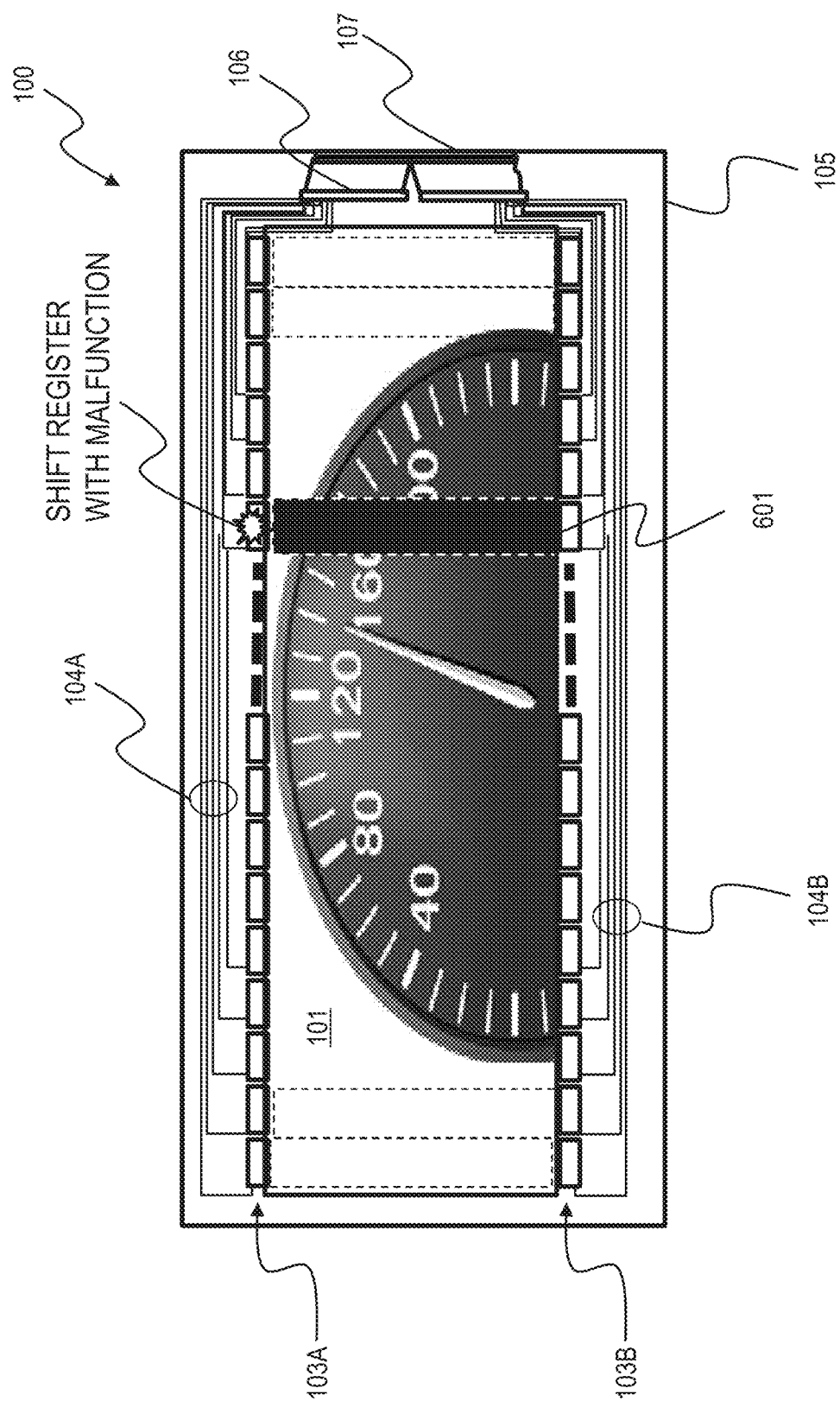
FIG. 6 is a diagram for explaining a display defect when a malfunction of the shift register occurs in the display device of Embodiment 1.

FIG. 6 is a diagram for explaining a display defect when a malfunction of the shift register occurs in the display device 100 of Embodiment 1.

In this embodiment, each shift register segment 102 receives a start pulse from the driver IC via the start signal supply wiring line 104, and therefore, it is not necessary to receive a carry signal from the shift register segment 103 of the preceding stage. Thus, even if a shift register unit 201 of one of the shift register segments 103 malfunctions, the shift register segments 103 of the following stages can operate normally as long as those shift register segments are not malfunctioning.

That is, since the effect of the defect of the shift register unit 201 remains within the shift register segment 103 to which the shift register unit 201 belongs, the erroneous display area 601 is limited to a band-like region corresponding to the shift register segment 103 in which the defect occurred. As a result, it is possible to prevent a serious defect where the majority of the display unit 101 of the display device 100 cannot display properly.

Embodiment 2

Below, Embodiment 2 of the present invention will be explained. The configurations common between Embodiment 1 and Embodiment 2 will not be described again.

Figure 7:
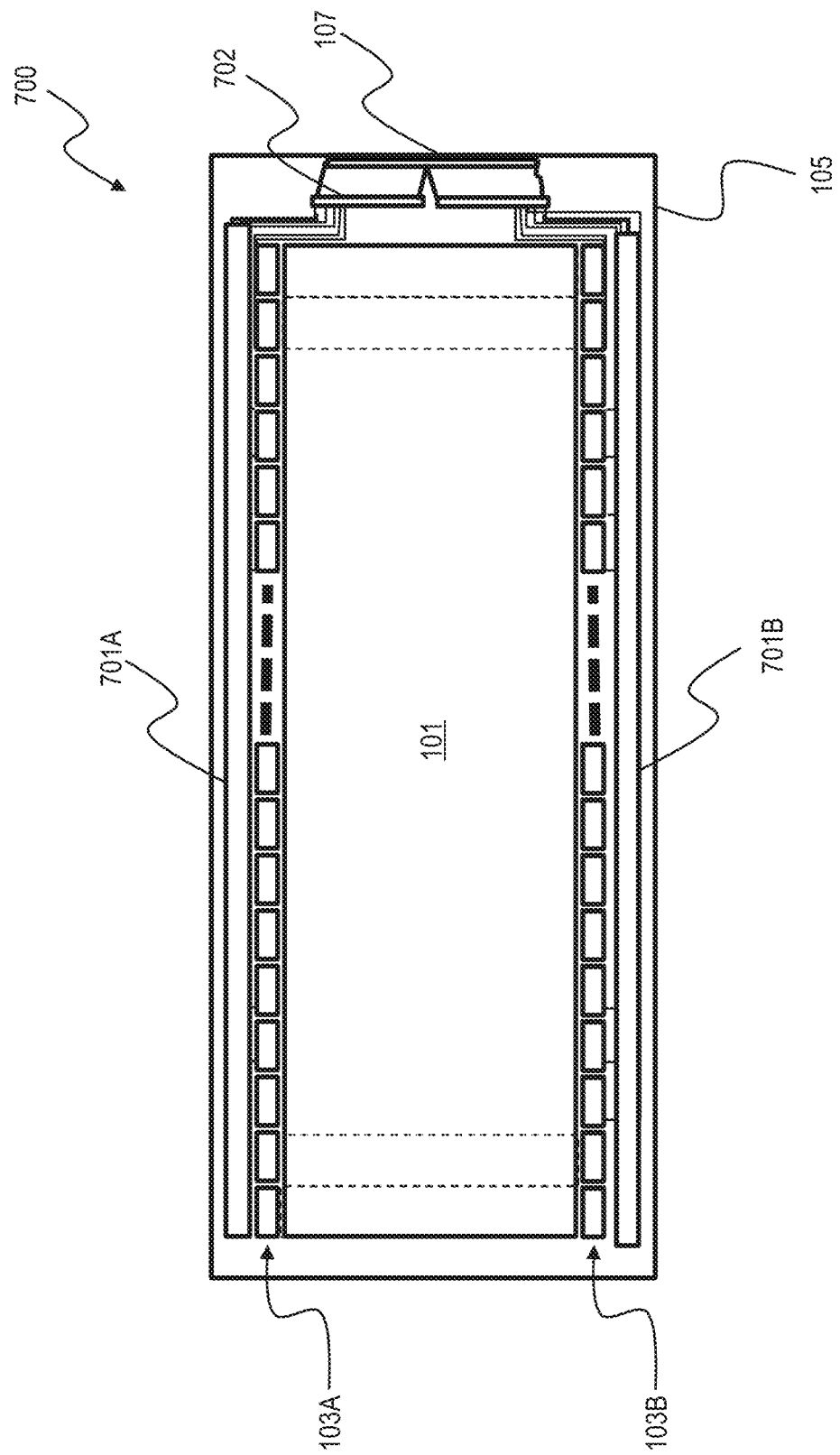
FIG. 7 is a diagram illustrating the structure of a display device of Embodiment 2.

FIG. 7 is a diagram illustrating the structure of a display device 700 of Embodiment 2.

In the display device 100 of Embodiment 1, it is necessary to supply a start pulse to each shift register segment 103. However, a generally-available driver IC does not have such a function, and thus, there is a necessity to prepare a special driver IC 106 for generating a start pulse for each shift register segment 103.

On the other hand, the display device 700 of Embodiment 2 has a shift register circuit 701 for generating a start signal to be supplied to each shift register segment 103, in addition to the plurality of shift register segments 103 similar to those of the display device 100 of Embodiment 1.

In the example of FIG. 7, the display device 700 has a start signal generating shift register circuit 701A that supplies a start pulse to the plurality of shift register segments 103A, and a start signal generating shift register circuit 701B that supplies a start pulse to the plurality of shift register segments 103B.

For example, when the display device 700 includes N number of shift register segments 103A, the start signal generating shift register circuit 701A includes N stages of shift register circuits. When the start signal generating shift register circuit 701A receives a start pulse from the driver IC 702, the shift register unit (not shown in the figure) of each stage generates and outputs a start pulse for each shift register segment 103A.

Thus, the driver IC 702 simply needs to supply a start pulse to the start signal generating shift register circuit 701, and does not need to generate the start pulse for each shift register segment 103. Because this allows for use of an ordinary driver IC, the cost of the device is reduced.

In this embodiment as well, even if the shift register unit 201 in the shift register segment 103 is defective, the effect is limited to the band-like area corresponding to that shift register segment 103 as in Embodiment 1.

Embodiment 3

Below, Embodiment 3 of the present invention will be explained. The configurations of Embodiment 3 that are common with Embodiment 1 or Embodiment 2 will not be described again.

As illustrated in FIGS. 2 and 4, among the plurality of shift register units 201 constituting one shift register segment 103 of Embodiment 1, the output terminals OUT other than that of the final stage are respectively connected to the scan signal lines G, and to the input terminals IN of the respective shift register units 201 of the subsequent stages. On the other hand, the output terminal OUT of the shift register unit 201 of the final stage is connected to the scan signal line G, but not connected to the input terminal IN of the shift register unit 201 of the subsequent stage.

Therefore, the capacitance of the load connected to the output terminal OUT of the shift register unit 201 of the final stage of the shift register segment 103 differs from the capacitance of the load connected to each output terminal OUT of other shift register units 201. Specifically, because the capacitance of the former is smaller than the capacitance of the latter, the waveform blunting due to the drop of the gate signal of the scan signal line G connected to the output terminal OUT of the final-stage shift register unit 201 is smaller than those of other shift register units 201, and as a result, the field-through voltage to the pixel electrode becomes slightly larger. As a result, the DC voltage component applied to the liquid crystal differs between the pixels connected to the scan signal line of the final stage and other pixels, and when the pixels are continuously driven, this difference would create an afterimage, which could result in non-uniformity of linear luminance that appears in cycle corresponding to the width of the display unit segment 102.

Figure 8:
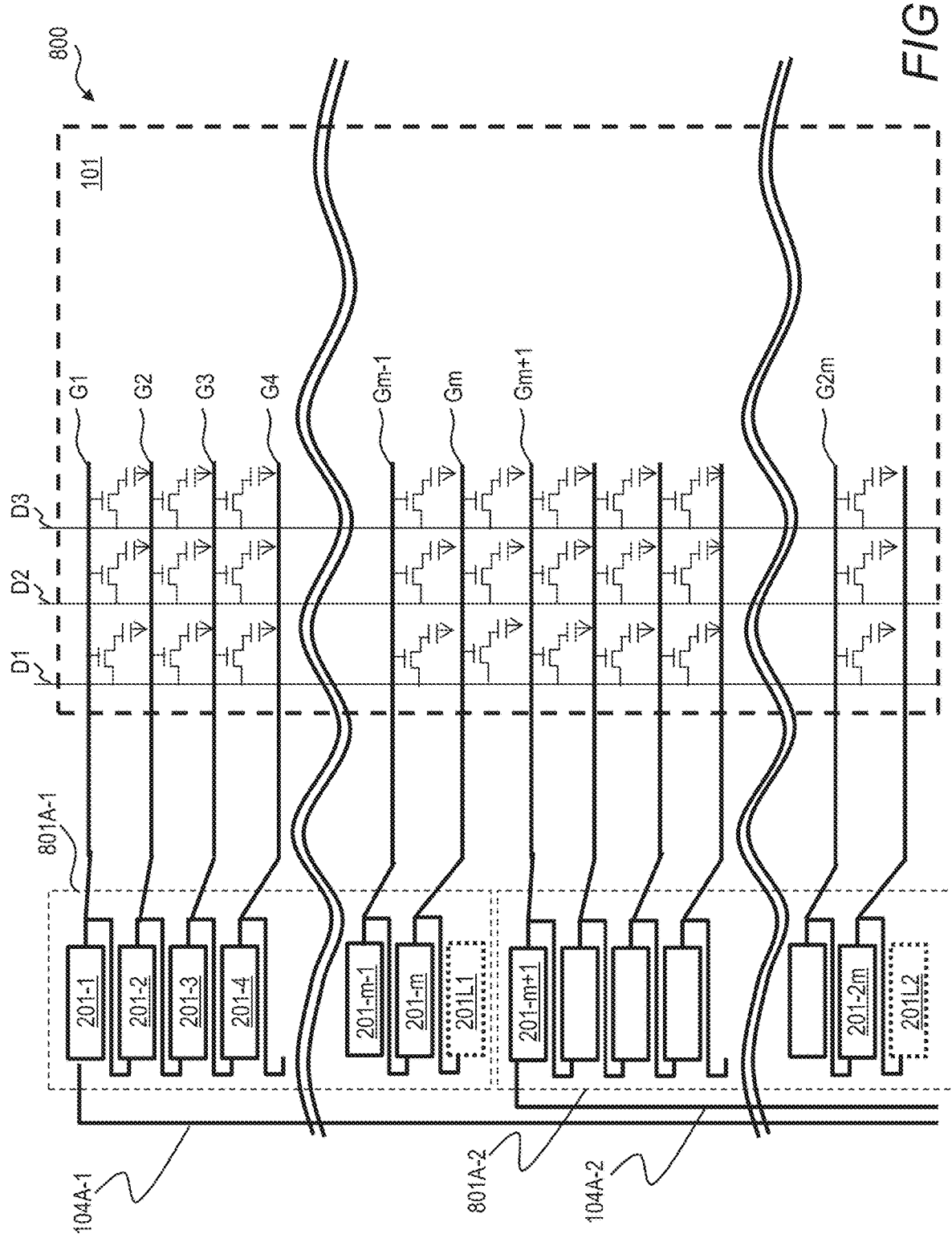
FIG. 8 is a diagram for explaining a display device of Embodiment 3.

FIG. 8 is a diagram for explaining a display device 800 of Embodiment 3.

The display device 800 of Embodiment 3 is the same as the display device 100 of Embodiment 1 except that the shift register segment 103 is replaced by a shift register segment 801. For example, shift register segments 801A-1 and 801A-2 illustrated in FIG. 8 replace the shift register segments 103A-1 and 103A-2 illustrated in FIG. 2, respectively.

The display device 800 of Embodiment 3 may alternatively use the shift register segment 801 instead of the shift register segment 103 of the display device 700 of Embodiment 2. The following description applies to both cases.

The shift register segment 801 of Embodiment 3 is the same as the shift register segment 103 except that a dummy shift register unit 201 not connected to the scan signal line G is connected after a series of shift register units 201 connected to the scan signal line G, respectively.

In the example of FIG. 8, the shift register segment 801A-1 includes shift register units 201-1 to 201-$m$ connected to the scan signal lines G1 to Gm, respectively. This is the same as the shift register units 201 included in the shift register segment 103A-1 illustrated in FIG. 2.

The shift register segment 801A-1 further includes a dummy shift register unit 201L1 connected after the shift register unit 201-$m$. The input terminal IN of the dummy shift register unit 201L1 is connected to the output terminal OUT of the shift register unit 201-$m$.

The output terminal OUT of the dummy shift register unit 201L1 is not connected to any scan signal line G. The shift register unit 201-$m$+1 of the first stage of the subsequent shift register segment 801A-2 receives a start pulse at the timing when the dummy shift register unit 201L1 receives a carry signal (that is, a scan signal of the shift register unit 201-$m$ of the preceding stage).

Similarly, a dummy shift register unit 201L2 is inserted after the shift register unit 201-$2m$ of the shift register segment 801A-2. The output terminal OUT of the shift register unit 201-2*m* is connected not only to the scan signal line G2*m*, but also to the input terminal IN of the dummy shift register unit 201L2.

This way, the output terminal OUT of the shift register unit 201 connected to the scan signal line G is always connected to the input terminal IN of the subsequent shift register unit 201. As a result, because the load capacitance of all the shift register units 201 connected to the scan signal line G becomes equal, the uneven waveform blunting of the gate signal of the scan signal line G is eliminated, and the non-uniformity of luminance at the borders of the display unit segments 102 is prevented.

Embodiment 4

Below, Embodiment 4 of the present invention will be explained. The configurations of Embodiment 4 that are common with Embodiments 1 to 3 will not be described again.

If one of the shift register segments 801 has a failure of the no output mode, the scan signal lines G connected to the shift register units 201 after the failed shift register unit, out of all the shift register units 201 of the shift register segment 801, cannot be turned on. The same applies to the shift register segment 103.

On the other hand, if one of the shift register segments 801 has a failure of the continuous clock mode, the scan signal lines G connected to the shift register units 201 after the failed shift register unit, out of all the shift register units 201 of the shift register segment 801, are repeatedly turned on and off. The same applies to the shift register segment 103.

In both cases, it is not possible to display information properly in the display unit segment 102 corresponding to the failed shift register segment 801. When this display device is installed in a car and a failure occurs in the display unit segment 102 that is to display information related to the safety of the passengers, such as a number indicating a vehicle speed or an emergency, for example, this would cause a problem even if other display unit segments 102 operate normally.

In this embodiment, the failed shift register segment 801 is detected, and the system receives the detection result as feedback. Then the system puts various countermeasures in place to mitigate the effect of the failure based on the detection result.

Figure 9:
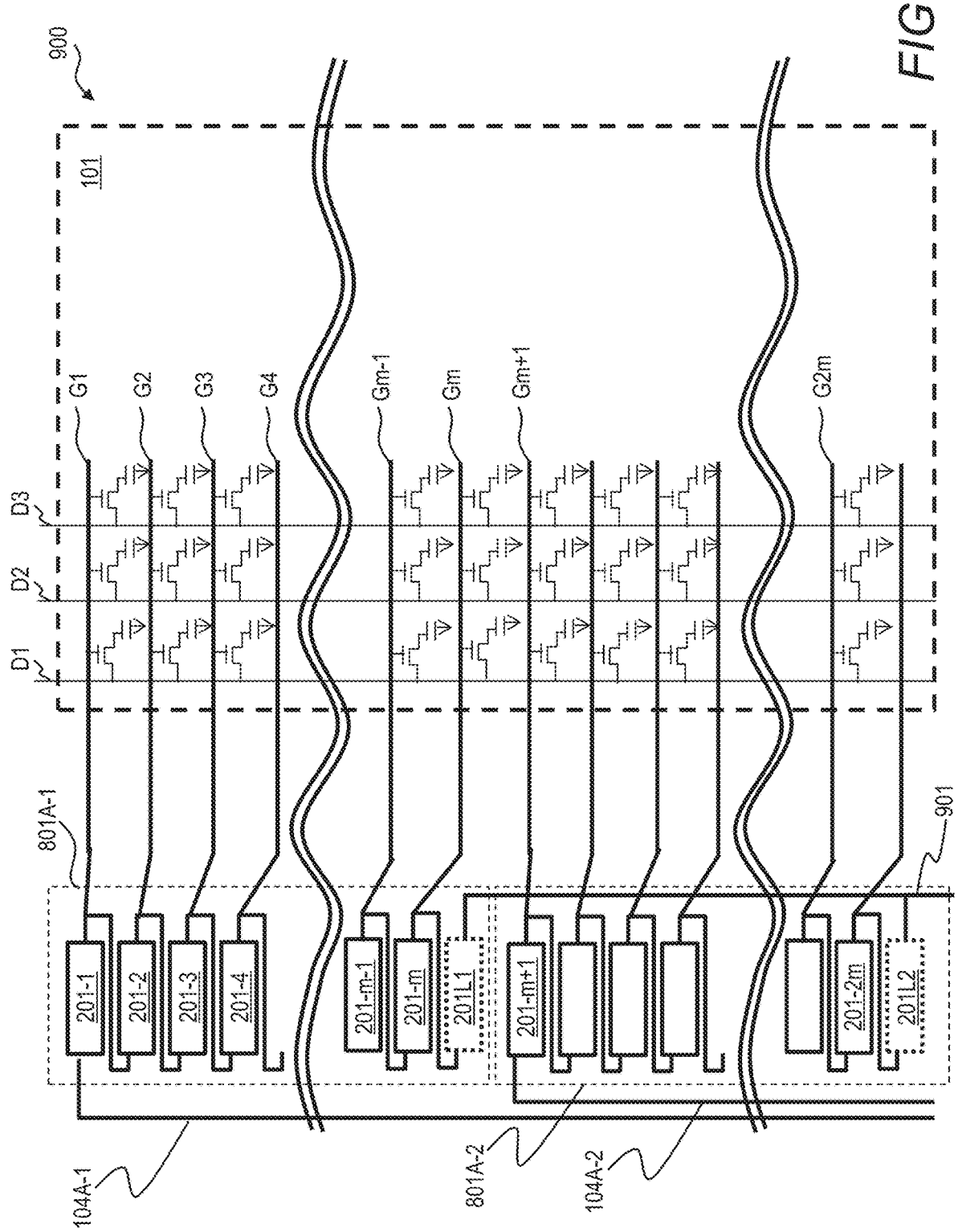
FIG. 9 is a diagram for explaining a display device of Embodiment 4.

FIG. 9 is a diagram for explaining a display device 900 of Embodiment 4.

The display device 900 of Embodiment 4 is the same as the display device 800 (see FIG. 8) of Embodiment 3 except for having a monitor output wiring line 901 for connecting and outputting all the output terminals OUT of the dummy shift register units 201L, which are in the final stage of each shift register segment 801, to the outside of the panel.

FIGS. 10A and 10B are diagrams for illustrating the design examples of the sizes of the transistors (TFTs) M1 to M4 constituting the shift register unit 201 of Embodiment 4.

FIG. 10A illustrates a design example of the main (that is, not a dummy) shift register unit 201, and FIG. 10B illustrates a design example of the dummy shift register unit 201L. In the examples of FIGS. 10A and 10B, the channel length L of the transistors M1 to M4 of the main unit is the same as that of the dummy unit.

The transistor M1 of the dummy shift register unit 201L is the load of the shift register unit 201 of the final stage. Thus, it is preferable that the channel width W of the transistor M1 of the dummy shift register unit 201L be the same as the channel width W of the transistor M1 of the main shift register unit 201. This makes it possible to suppress the non-uniformity in luminance at the borders of the display unit segments 102.

The output terminal OUT of the main shift register unit 201 is connected to the scan signal line G. It is preferable that the channel width of the transistor M2 of the main shift register unit 201 be large enough so that sufficient charges can be supplied to charge the gate of the TFT of each pixel via the scan signal line G. On the other hand, the output terminal OUT of the dummy shift register unit 201L is not connected to the scan signal line G, and thus the load capacitance thereof is small. Thus, the channel width W of the transistor M2 of the dummy shift register unit 201L can be smaller than the channel width W of the transistor M2 of the main shift register unit 201. As a result, the area of the dummy shift register units can be reduced, which gives more freedom in designing the main shift register unit 201.

It is preferable that the channel width W of the transistor M3 of the dummy shift register unit 201L be the same as or greater than the channel width W of the transistor M3 of the main shift register unit 201. This reduces the low-level noise.

The channel width W of the transistor M4 of the dummy shift register unit 201L may be the same as the channel width W of the transistor M4 of the main shift register unit 201.

Figure 11:
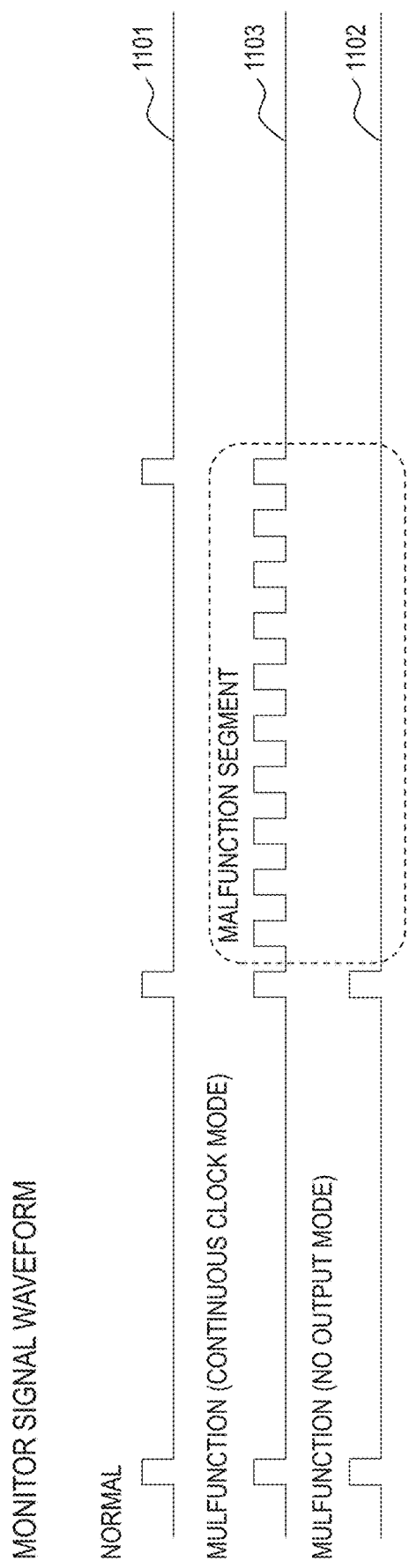
FIG. 11 is a diagram for explaining the monitor signal waveform of Embodiment 4.

FIG. 11 is a diagram for explaining the monitor signal waveform observed at the monitor output wiring line 901 of Embodiment 4.

A monitor signal waveform 1101 is an example of the waveform observed at the monitor output wiring line 901 when the shift register segments 801 have no malfunction. In this case, the monitor output wiring line 901 observes a pulse output from the dummy shift register unit 201L connected after the shift register unit 201 of the final stage of each shift register segment 801.

The timing at which this pulse is output corresponds to the timing at which the shift segment unit 201 of the first stage of the shift register segment 801 immediately following that shift register segment 801 outputs a pulse to the scan signal line G.

A monitor signal waveform 1102 is an example of the waveform observed at the monitor output wiring line 901 when one of the shift register segments 801 has a malfunction of the no output mode. In this case, in the shift register segment 801 with the malfunction, the carry signal does not reach the shift register unit 201 of the final stage. Thus, the dummy shift register unit 201L connected thereafter does not output a pulse when a pulse is supposed to be output in a normal mode.

A monitor signal waveform 1103 is an example of the waveform observed at the monitor output wiring line 901 when one of the shift register segments 801 has a malfunction of the continuous clock mode. In this case, the shift register unit 201 of the final stage of the shift register segment 801 with the malfunction outputs a clock signal. Thus, the dummy shift register unit 201L connected thereafter outputs a pulse at other timings than the timing to output a pulse in a normal mode.

With this configuration, it is possible not only to detect the presence of malfunction, but also to identify the shift register segment 801 with malfunction.

Figure 12:
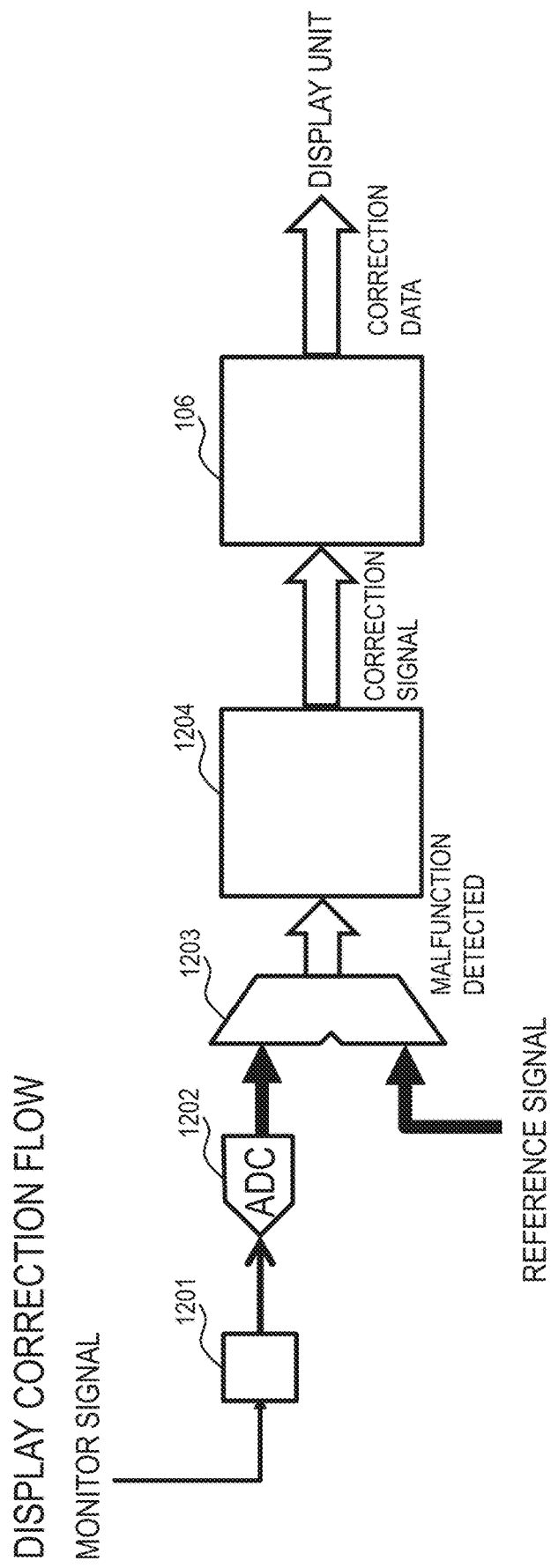
FIG. 12 is a diagram illustrating the process flow of the display correction performed by the display device of Embodiment 4.

FIG. 12 is a diagram illustrating the process flow of the display correction performed by the display device of Embodiment 4.

The monitor signal output to the monitor output wiring line 901 is input to the level shift circuit 1201. Since the monitor signal has the high level and low level following the gate of the TFT of the pixel, the level shift circuit 1201 is required to connect to the LSI. The level shift circuit 1201 may be fabricated by a TFT on the substrate 105 of the display device 100 or may be implemented by a level shift IC.

The monitor signal that went through the level shift by the level shift circuit 1201 is converted into a digital signal by an analog-to-digital converter (ADC) 1202, and compared with a reference signal by a comparator 1203.

The reference signal is, for example, a signal indicating the timing of pulses that should be output to the monitor output wiring line 901 if each shift register segment 801 is operating normally. The reference signal is generated by the controller IC 1204.

The comparator 1203 outputs the result of comparison between the monitor signal, which was converted into the digital signal, and the reference signal to the controller IC 1204. When the controller IC 1204 detects malfunction of one of the shift register segments 801 based on the input from the comparator 1203, the controller IC 1204 generates a correction signal corresponding to the malfunction and outputs the signal to the driver IC 106. The driver IC 106 then generates correction data based on the correction signal and outputs the correction data to the display unit 101.

For example, when the controller IC 1204 recognizes that a pulse is not detected at a timing at which a pulse is supposed to be detected in the monitor signal based on the information input from the comparator 1203, the controller IC 1204 determines that the shift register segment 801 corresponding to that timing has a malfunction of the no output mode. When the controller IC 1204 recognizes that a pulse is detected at a timing at which a pulse is not supposed to be detected in the monitor signal based on the information input from the comparator 1203, the controller IC 1204 determines that the shift register segment 801 corresponding to that timing has a malfunction of the continuous clock mode.

Examples of the correction signals and correction data for malfunction include the following. For example, the controller IC 1204 may generate a correction signal for displaying black on the display unit segment 102 corresponding to the shift register segment 103 with malfunction (that is, the display unit segment 102 with malfunction), and the driver IC 106 may output the correction data for displaying black in accordance with the correction signal.

Specifically, for the malfunction of no output mode, for example, the scan signal is not supplied to at least some of the scan signal lines G connected to the failed shift register segment 801. The area not supplied with the scan signal does not display black due to the coupling from the video signal, and thus, it is preferable to supply black data to all of the pixels corresponding to the failed shift register segment 801 so that the display unit segment 102 displays black. On the other hand, for the malfunction of the continuous clock mode, for example, the scan signal is continuously supplied to at least some of the scan signal lines G connected to the failed shift register segment 801. Thus, the controller IC 1204 supplies black data to all of the pixels corresponding to the failed shift register segment 801 without stopping the supply of start pulse to the failed shift register segment 801.

Alternatively, the controller IC 1204 may generate a correction signal for displaying a warning that indicates a part of the display unit 101 has failed in the normally-operating display unit segments 102 in the display unit 101, and the driver IC 106 may output the correction data for displaying the warning in accordance with the correction signal.

Although it is possible to display black on the failed display unit segment 102 as described above, since the operating condition differs from the normal part, a minute DC voltage could be generated in the pixel and band-shaped burn-in is likely to occur by continuous energization. By displaying the warning as described above, it is possible to prompt the user to have the display device 900 replaced.

In addition, when the vehicle (not shown in the figure) equipped with the display device 900 has a communication capability, the controller IC 1204 may send to the dealer of the vehicle a notification of the malfunction of the display device 900 using the communication capability. This allows the dealer to take appropriate measures such as replacing the display device 900.

Alternatively, the controller IC 1204 may generate a correction signal for displaying important information to be displayed in the display unit 101 in the normally-operating display unit segments 102, and the driver IC 106 may output the correction data for displaying the important information in the normally-operating display unit segments 102 in accordance with the correction signal.

As described above, by monitoring the output of each segment, it is possible to detect a malfunction of each segment and take appropriate correction measures. As a result, loss of information due to a segment failure is minimized, and when the display device 900 is installed in a car, for example, the safety of the passengers can be ensured.

The monitor output wiring line 901 of this embodiment may be connected to the output terminal OUT of the shift register unit 201 of the final stage of each shift register segment 103 of Embodiment 1, instead of the dummy shift register unit 201L. In this case as well, malfunctions can be detected in a manner similar to above.

However, in this case, the monitor output wiring line 901 is also connected to the output terminal OUT of the shift register unit 201 of the final stage, in addition to the scan signal line G, and the load capacitance thereof would differ from the load capacitance of other shift register units 201. As a result, the non-uniformity of luminance as described in Embodiment 3 occurs at the borders of the display unit segments 102.

In this embodiment, it is possible to prevent the increase in load capacitance due to the pulling out of the monitor output wiring line 901 from affecting the scan signal line G by utilizing the output of the dummy shift register unit 201L. Because the effect on the scan signal line G is eliminated, the monitor output wiring line 901 can be integrated into one and shared by all the shift register segments 801, which prevents an increase in frame width due to an increase in the wiring lines.

Below, several examples of the process when a malfunction is detected in one of the shift register segments 801 in the display device 900 of Embodiment 4 will be described.

Figure 13:
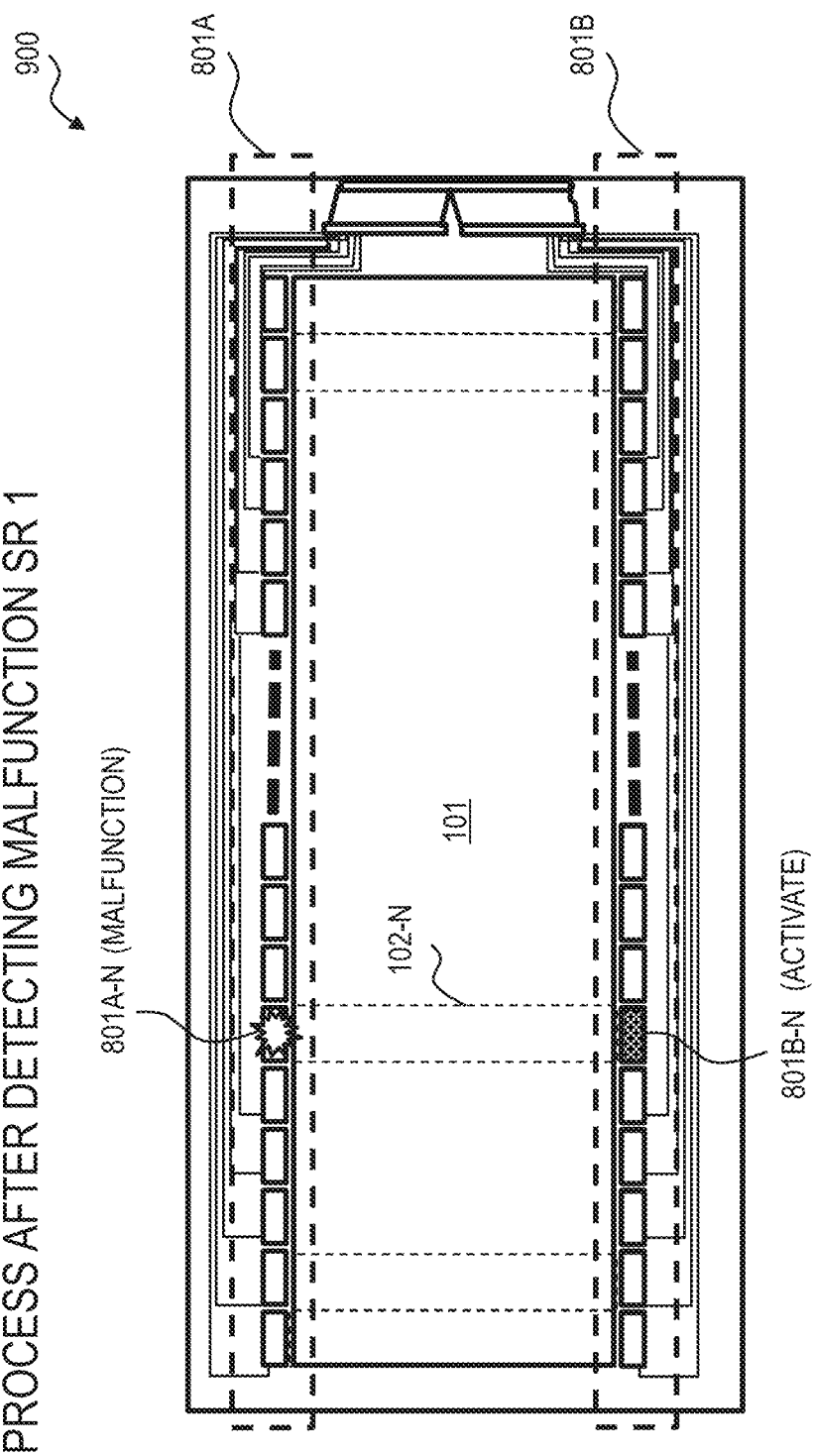
FIG. 13 is a diagram for explaining the first example of the process when a failure is detected in shift register segments of the display device of Embodiment 4.

FIG. 13 is a diagram for explaining the first example of the process when a failure is detected in the shift register segments 801 of the display device 900 of Embodiment 4.

In the example of FIG. 13, the shift register constituted of a plurality of shift register segments 801A is a master shift register (first shift register) used in the normal operation, and the shift register constituted of a plurality of shift register segments 801B is a spare shift register (second shift register) used when the master shift register has a malfunction. When all shift register segments 801A are normal, the necessary clock signal and start pulse are supplied to the shift register segments 801A, and no start pulse is supplied to the shift register segments 801B. Although the clock signal may be supplied, it is preferable not to supply the clock signal when the segments are not used, to protect the circuit from deterioration.

In this example, the case where a shift register segment 801A-N, which is one of a plurality of shift register segments 801A, has a malfunction will be described as an example. When a failure of shift register segment 801A-N is detected based on the monitor signal, the controller IC 1204 stops the supply of start pulse to that shift register segment 801A-N, and starts supplying a start pulse and clock signal to a shift register segment 801B-N corresponding to that shift register segment 801A-N, which shares the same scan signal G (or in other words, the shift register segment 801B-N is activated).

This way, the scan signal line G of the display unit segment 102-N corresponding to the failed shift register segment 801A-N in the display unit 101 is driven by the spare shift register segment 801B-N, and other scan signal lines G are driven by the shift register segments 801A. As a result, it is possible to continue the display in all areas of the display unit 101.

Similarly, when another master shift register segment 801A differing from the shift register segment 801A-N has a malfunction, the supply of start pulse to the failed shift register segment 801A is stopped, and the supply of start pulse to the corresponding spare shift register segment 801B is started, which allows the display to be continued.

As a result, unless both the master shift register segment 801A and the spare shift register segment 801B corresponding to the same display segment 102 fail, a display defect would not occur.

The supply of start pulse and clock signal is started and stopped by the driver IC 106 controlled by the controller IC 1204. The same applies to FIGS. 14A to 14C below.

Figure 14A:
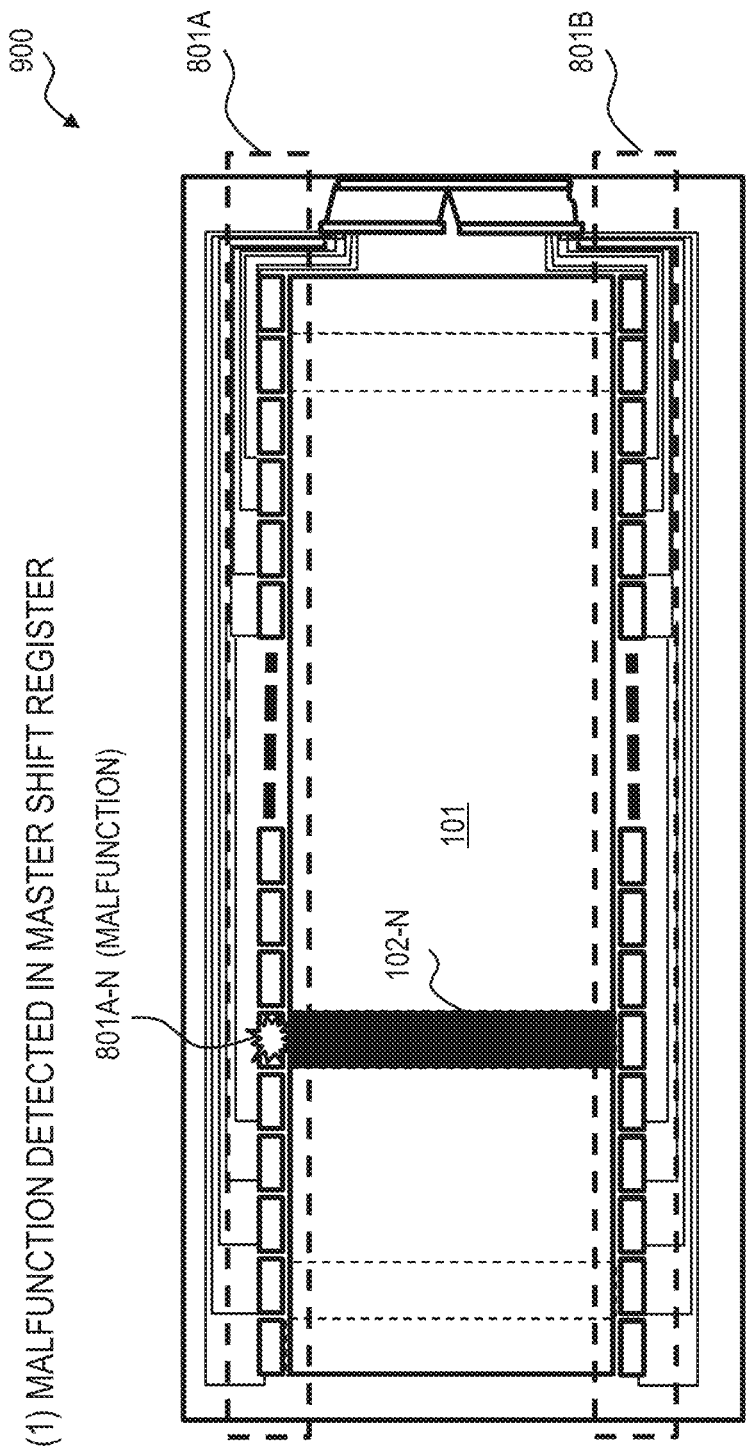
FIGS. 14A to 14C are diagrams for explaining the second example of the process when a malfunction is detected in the shift register segments of the display device of Embodiment 4.
Figure 14B:
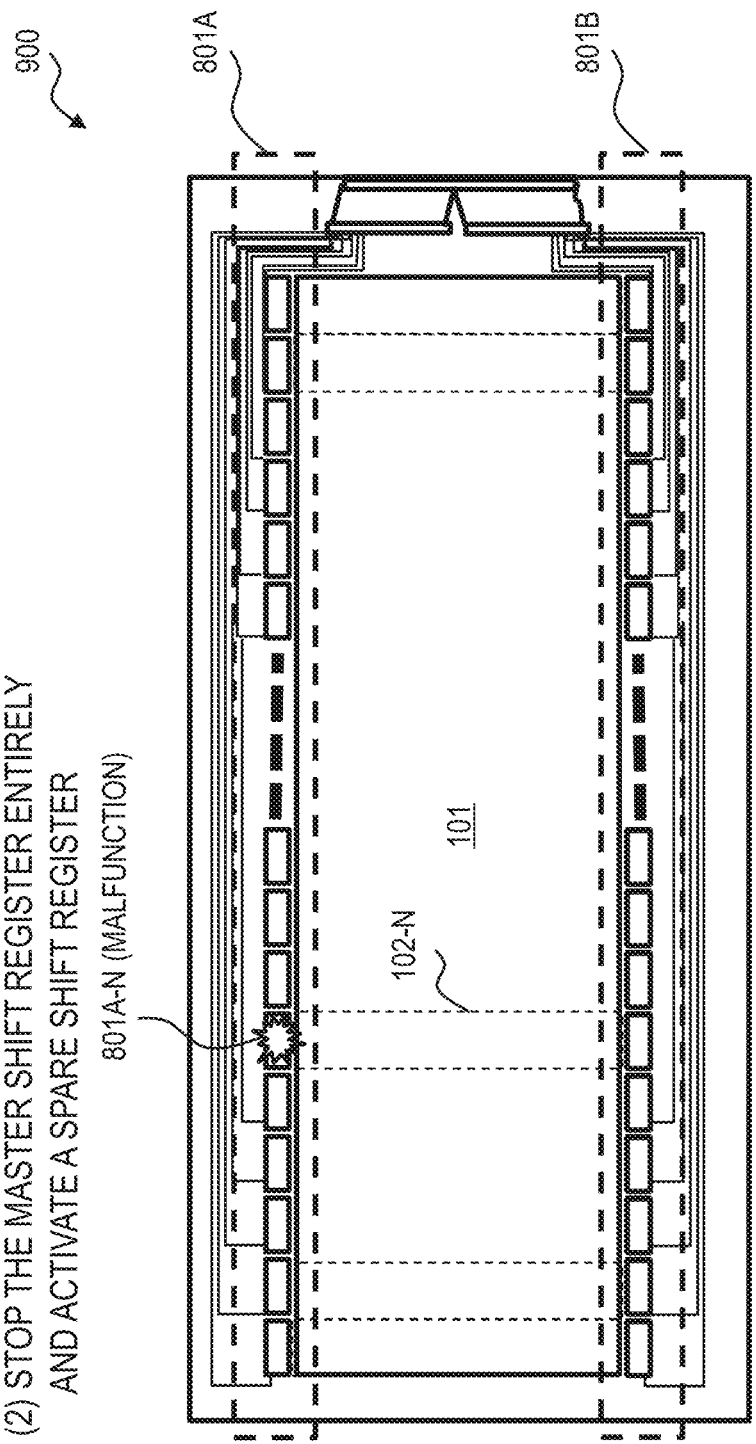
Figure 14C:
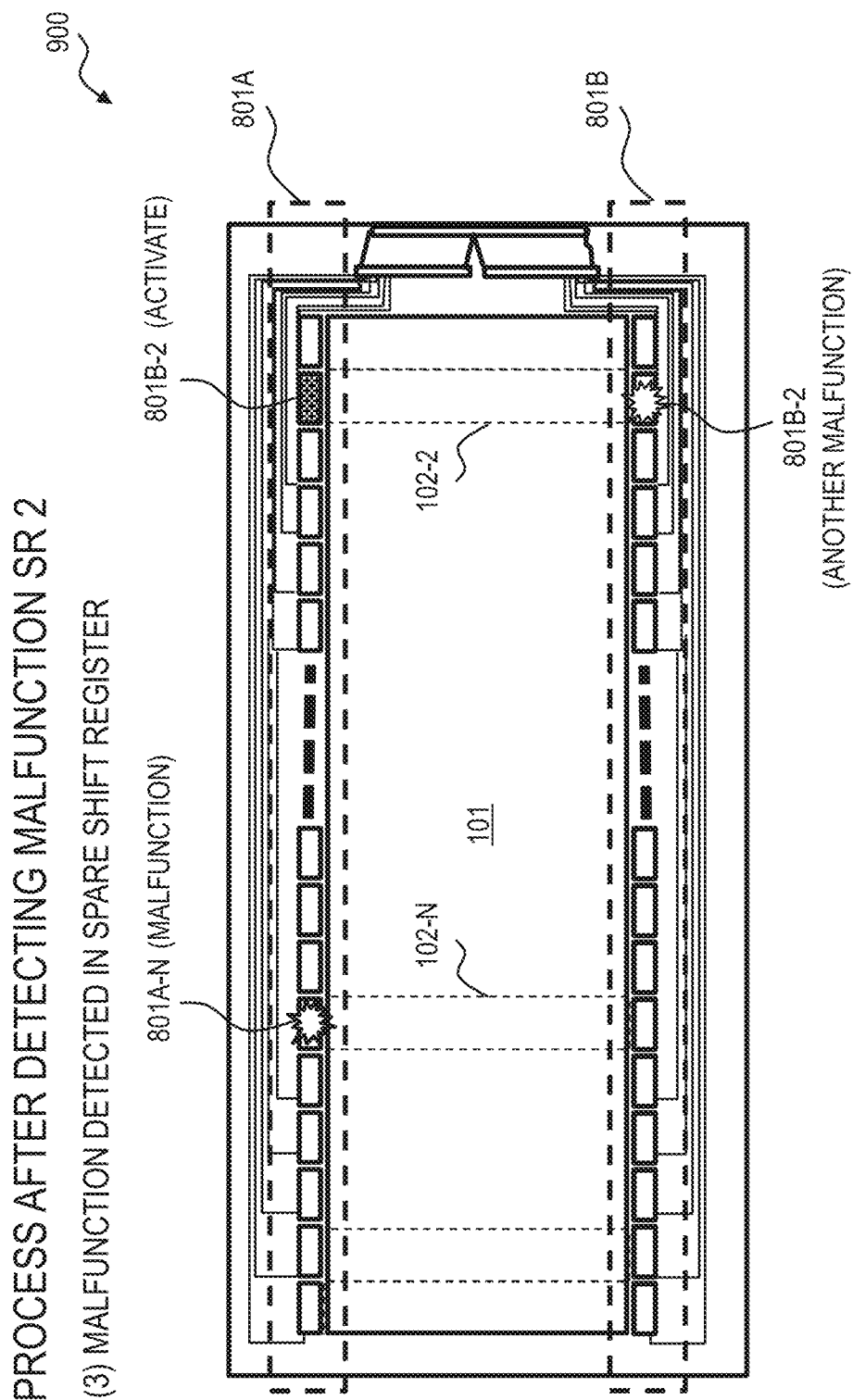

FIGS. 14A to 14C are diagrams for explaining the second example of the process when a malfunction is detected in the shift register segments 801 of the display device 900 of Embodiment 4.

In a manner similar to the example of FIG. 13, the master shift register segment 801A-N has a malfunction. If nothing is done, the display unit segment 102-N corresponding thereto would have a display defect (FIG. 14A).

When the malfunction of the shift register segment 801A-N is detected, the controller IC 1204 stops not only the failed shift register segment 801A-N but also all the master shift register segments 801A, and activates the spare side shift register segments 801B. (FIG. 14B). Specifically, the controller IC 1204 stops the supply of start pulse and clock signal to the master shift register segments 801A, and starts the supply of start pulse and clock signal to the spare shift register segments 801B. This makes it possible to avoid a display defect.

Thereafter, if one of the spare shift register segments 801B (the shift register segment 801B-2, for example) has a malfunction, the controller IC 1204 stops the supply of the start pulse to the shift register segment 801B-2, and starts supplying a start pulse to the master shift register segment 801A-2 that corresponds to the shift register segment 801B-2. If the supply of clock signal to the shift register segments 801A was also stopped, the supply is resumed as well (FIG. 14C). This way, it is possible to avoid a display defect in the display unit segment 102-2 that corresponds to the shift register segments 801B-2 and 801A-2.

Similarly, when another spare shift register segment 801B has a malfunction, the corresponding master shift register segment 801A is activated. As a result, unless both the master shift register segment 801A and the spare shift register segment 801B corresponding to the same display unit segment 102 fail, a display defect would not occur.

As described above, according to Embodiment 4, a malfunction is detected for each shift register segment 801, and the failed shift register segment 801 is replaced by the corresponding shift register segment 801. As a result, unless the two shift register segments 801 corresponding to one display unit segment 102 both fail, a display defect would not occur, and thus, the fault tolerance of the display device 100 is improved.

In Embodiment 4, an example in which the start pulse is supplied to each shift register segment 801 from the driver IC 106 is described as in Embodiment 1. However, the start pulse may be supplied from the start signal generating shift register circuit 701 to each shift register segment 801 as in Embodiment 2. In this case, the switching between respective shift register segments illustrated in FIG. 14C cannot be performed, but switching between the entire master shift register segments 801 and the entire spare shift register segments 801 is possible, and thus, the fault tolerance is improved.

Embodiment 5

Below, Embodiment 5 of the present invention will be explained. The configurations of Embodiment 5 that are common with the respective embodiments described above will not be described again.

Figure 15:
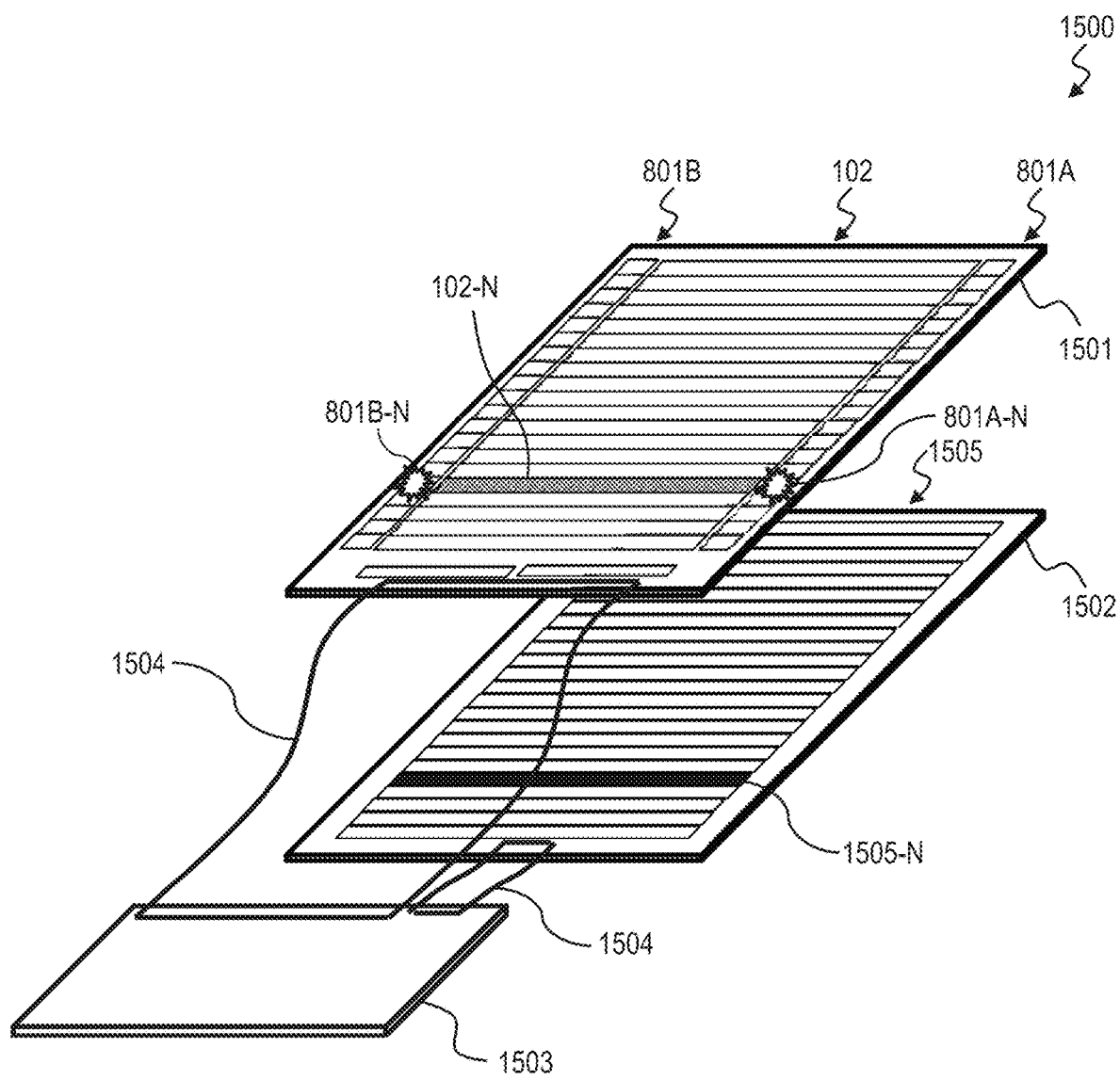
FIG. 15 is a perspective view illustrating the configuration of a display device of Embodiment 5 of the present invention.

FIG. 15 is a perspective view illustrating the configuration of a display device 1500 of Embodiment 5 of the present invention.

The display device 1500 of this embodiment includes an LCD panel 1501 constituted of a segmented display unit and shift register circuit, a segmented LED (Light Emitting Diode) backlight unit 1502, and a control circuit board 1503 connected to those by FPC (Flexible Printed Circuits) 1504 and the like.

A plurality of display unit segments 102, a plurality of master shift register segments 801A, and a plurality of spare shift register segments 801B are formed on the LCD panel 1501.

The LED backlight unit 1502 is a direct-lit backlight unit in which a plurality of LED chips (not shown in the figure) are arranged immediately below the LCD panel 1501. The LED chips are segmented in a manner similar to the LCD panel 1501, and arranged such that one LCD segment (display unit segment 102) corresponds to one backlight segment 1505.

Although the LCD panel 1501 and the LED backlight unit 1502 are illustrated separately in FIG. 15 for the sake of explanation, the LED backlight unit 1502 is actually disposed immediately below the LCD panel 1501. Each backlight segment 1505 serves as a light source that emits light passing through the corresponding display unit segment 102.

The individual backlight segments 1505 are connected such that they can be individually turned on and off by signals from the control circuit board 1503. The controller IC 1204 (FIG. 12) may be mounted on the control circuit board 1503, and the controller IC 1204 may generate a signal to turn on and off each backlight segment 1505 and send the signal to the LED backlight unit 1502.

When a certain segment of the LCD panel 1501 has a malfunction, the controller IC 1204 identifies the failed segment based on the monitor signal of the shift register segment 801, and turns off only the backlight segment 1505 corresponding to the failed segment for black display.

For example, when both the master shift register segment 801A-N and the spare shift register segment 801B-N corresponding to display segment 102-N has a malfunction, the controller IC 1204 turns off the backlight segment 1505N corresponding to the display unit segment 102-N. This way, the display unit segment 102-N displays black. Also, this keeps off the LEDs not necessary for display, power consumption can be reduced.

The embodiments of the present invention have been described, but the present invention is not limited to those embodiments described above. Those skilled in the art can easily modify, add, or convert the elements of the above-described embodiments within the scope of the present invention. It is possible to replace part of the configuration of one embodiment with a configuration of another embodiment, and it is also possible to add a configuration of one embodiment to a configuration of another embodiment.

What is claimed is:

1. A display device, comprising:
    a display unit that includes a plurality of pixels that are defined by a plurality of scan signal lines and a plurality of video signal lines;
    a shift register connected to the plurality of scan signal lines and outputting a pulse signal sequentially, the shift register being divided into a plurality of shift register segments, each including at least one shift register unit;
    a clock signal line that supplies a clock signal to each of the plurality of shift register segments;
    a plurality of start signal lines that supply a plurality of start signals to each of the plurality of shift register segments;
    a driver that generates the clock signal to be supplied to each of the plurality of shift register segments, and a video signal to be input to each of the plurality of pixels;
    a controller that controls the driver for generating the clock signal, the video signal, the controller monitoring output of each of the plurality of shift register segments, and detecting a malfunction of any one of the plurality of shift register segments; and
    a monitor output wiring line connected to an output terminal of at least one shift register unit of a final shift register segment among the plurality of shift register segments,
    wherein at least one shift register unit of a first shift register segment among the plurality of shift register segments outputs a first pulse signal at a first prescribed timing after receiving a first start signal via a first start signal line among the plurality of start signal lines,
    wherein at least one shift register unit of a second shift register segment, differing from the first shift register segment, among the plurality of shift register segments, outputs a second pulse signal at a second prescribed timing after receiving a second start signal via a second start signal line among the plurality of start signal lines,
    wherein the controller detects the malfunction of the any one of the plurality of shift register segments by comparing a pulse signal output to the monitor output wiring line with a prescribed reference signal,
    wherein the output terminal of the at least one shift register unit of the final shift register segment among the plurality of shift register segments is not connected to any one of the plurality of scan signal lines, and
    wherein one of the plurality of start signals is input to one of the plurality of shift register segments at a timing when a carry signal is received by the at least one shift register unit of the final shift register segment among the plurality of shift register segments.

2. The display device according to claim 1, wherein the driver generates the plurality of start signals supplied to each of the plurality of shift register segments,
    wherein the shift register includes a first shift register and a second shift register,
    wherein the plurality of scan signal lines connected to respective plurality of shift register segments of the first shift register are also connected to respective plurality of shift register segments of the second shift register corresponding to the respective plurality of shift register segments of the first shift register,
    wherein the controller is configured to:
    control the driver to supply the first start signal to all of the plurality of shift register segments of the first shift register; and
    control the driver to stop supplying the first start signal to the shift register segment with malfunction if malfunction of one of the shift register segments of the first shift register is detected and supply the second start signal to a shift register segment of the second shift register corresponding to the shift register segment with malfunction.

3. The display device according to claim 1, wherein the controller controls the driver such that a signal for displaying black is output as a video signal to be input to a pixel corresponding to one of the plurality of shift register segments with malfunction.

4. The display device according to claim 1, wherein the controller controls the driver such that a signal for displaying information is output to a pixel corresponding to each of the plurality of shift register segments with no malfunction.

5. The display device according to claim 1, further comprising a start signal generating shift register,
    wherein a pulse signal output from a start signal generating shift register unit that constitutes the start signal generating shift register is supplied as a start signal for the plurality of shift register segments.

6. The display device according to claim 1, further comprising a backlight unit disposed immediately below the display unit,
    wherein the backlight unit is divided into backlight segments that are turned on and off independently of each other based on a signal from the controller,
    wherein the backlight segments each correspond to an area corresponding to each of the plurality of shift register segments of the display unit, and
    wherein, when the controller detects a malfunction of one of the plurality of shift register segments, the controller is configured to send a signal to the backlight unit to turn off the backlight segment corresponding to an area of the display unit that corresponds to the shift register segment with malfunction.

7. The display device according to claim 1, wherein the driver generates the plurality of start signals supplied to each of the plurality of shift register segments,
    wherein the shift register includes a first shift register and a second shift register,
    wherein the plurality of scan signal lines connected to respective plurality of shift register segments of the first shift register are also connected to respective plurality of shift register segments of the second shift register corresponding to the respective plurality of shift register segments of the first shift register,
    wherein the controller is configured to:

control the driver such that the first start signal is supplied to all of the respective plurality of shift register segments of the first shift register; and control the driver such that the supply of the first start signal to all of the respective plurality of shift register segments of the first shift register is stopped if malfunction of one of the shift register segments of the first shift register is detected, and such that the second start signal is supplied to all of the respective plurality of shift register segments of the second shift register.

8. The display device according to claim 7, wherein the controller is configured to control the driver such that the supply of one of the plurality of start signals to the shift register segment with malfunction is stopped if the malfunction of one of the respective plurality of shift register segments of the second shift register is detected after the supply of the second start signal to all of the respective plurality of shift register segments of the second shift register has started, and such that the first start signal is supplied to a shift register segment of the first shift register corresponding to the shift register segment with malfunction.

9. A display device, comprising:
a plurality of shift register segments;
a monitor output wiring line connected to an output terminal of at least one shift register unit of a final shift register segment among the plurality of shift register segments; and
a controller circuit,
wherein each of the plurality of shift register segments is connected to a plurality of scan signal lines for a series of two or more pixels and has a start signal line independent of the other shift register segments,
wherein the monitor output wiring line is connected to the plurality of shift register segments,
wherein the controller circuit is configured to:
identify a malfunction of at least one of the plurality of shift register segments by comparing a pulse signal output to the monitor output wiring line with a predetermined reference signal; and
output a start signal in accordance with the identified malfunction,
wherein the output terminal of the at least one shift register unit of the final shift register segment among the plurality of shift register segments is not connected to any of the plurality of scan signal lines, and
wherein the start signal is input to one of the plurality of shift register segments at a timing when a carry signal is received by the at least one shift register unit of the final shift register segment among the plurality of shift register segments.

10. A display device, comprising:
a display unit that includes,
a plurality of scan signal lines;
a plurality of video signal lines;
a plurality of pixels arranged in a grid pattern in which each pixel includes a pixel electrode;
a switching element connected to one of the plurality of scan signal lines, one of the plurality of video signal lines and the pixel electrode, and configured to turn on/off a video signal to the pixel electrode;
a shift register connected to the plurality of scan signal lines and configured to output a pulse signal sequentially, the shift register being divided into a plurality of shift register segments, each shift register segment including a plurality of shift register units connected and spatially arranged in a sequential order and supplying scan signals to the plurality of scan signal lines, each of the plurality of shift register units including a final shift register unit having an output terminal;
a clock signal line that supplies a clock signal to each of the plurality of shift register segments;
a plurality of start signal lines that supply a plurality of start signals to each of the plurality of shift register segments;
a driver configured to generate the clock signal to be supplied to each of the plurality of shift register segments, and the video signal to be supplied to the plurality of video signal lines;
a monitor output wiring line connected to the output terminal of the final shift register unit of each of the plurality of the shift register segments; and
a controller configured to monitor the output signal of the monitor output wiring line and detect a malfunction of any one of the plurality of shift register segments.

* * * * *